US012236869B2

(12) United States Patent
Wang et al.

(10) Patent No.: US 12,236,869 B2
(45) Date of Patent: Feb. 25, 2025

(54) DISPLAY PANEL AND DISPLAY DEVICE

(71) Applicant: TIANMA MICROELECTRONICS CO., LTD., Shenzhen (CN)

(72) Inventors: Lihua Wang, Shenzhen (CN); Yuheng Zhang, Shenzhen (CN); Qiongqin Mao, Shenzhen (CN); Yang Nan, Shenzhen (CN); Tingling Li, Shenzhen (CN); Yimiao Ding, Shenzhen (CN)

(73) Assignee: TIANMA MICROELECTRONICS CO., LTD., Shenzhen (CN)

( * ) Notice: Subject to any disclaimer, the term of this patent is extended or adjusted under 35 U.S.C. 154(b) by 232 days.

(21) Appl. No.: 17/967,086

(22) Filed: Oct. 17, 2022

(65) Prior Publication Data
US 2023/0042146 A1 Feb. 9, 2023

(30) Foreign Application Priority Data

Jun. 30, 2022 (CN) .......................... 202210773012.2

(51) Int. Cl.
G09G 3/3233 (2016.01)
H01L 25/075 (2006.01)
H01L 29/786 (2006.01)

(52) U.S. Cl.
CPC ....... G09G 3/3233 (2013.01); H01L 25/0753 (2013.01); H01L 29/78648 (2013.01);
(Continued)

(58) Field of Classification Search
CPC ...... G09G 3/32; G09G 3/3233; G09G 3/3241; G09G 3/3258; G09G 3/3426; G09G 2300/0426; G09G 2300/0443; G09G 2300/0842; G09G 2300/0895; G09G 2310/0208; G09G 2310/0251; G09G 2310/0264; G09G 2310/0426; G09G 2310/061; G09G 2320/0238;
(Continued)

(56) References Cited

U.S. PATENT DOCUMENTS

2004/0246209 A1 12/2004 Sung
2005/0237282 A1* 10/2005 Miwa .................. G09G 3/3233
345/76

(Continued)

FOREIGN PATENT DOCUMENTS

CN 106920836 A 7/2017
CN 109817645 A 5/2019
(Continued)

Primary Examiner — Amr A Awad
Assistant Examiner — Aaron Midkiff
(74) Attorney, Agent, or Firm — KDW Firm PLLC

(57) ABSTRACT

Provided are a display panel and a display device. The display panel includes a pixel driver circuit. The pixel driver circuit includes a light-emitting module, a drive transistor and at least one light-emitting control transistor. The drive transistor, the light-emitting control transistor and the light-emitting module are connected in series between a first power supply signal terminal and a second power supply signal terminal, and at least one of the drive transistor or the light-emitting control transistor is a first double-gate transistor. The first double-gate transistor includes a first gate, a second gate and a first source, and the second gate is electrically connected to the first source.

19 Claims, 21 Drawing Sheets

(52) U.S. Cl.
CPC ............... *G09G 2300/0426* (2013.01); *G09G 2300/0842* (2013.01); *G09G 2330/021* (2013.01)

(58) Field of Classification Search
CPC ...... G09G 2320/0646; G09G 2330/021; H01L 25/0753; H01L 29/78645; H01L 29/78648
See application file for complete search history.

(56) References Cited

U.S. PATENT DOCUMENTS

| | | | |
|---|---|---|---|
| 2021/0304672 A1* | 9/2021 | Kim | H10K 59/1213 |
| 2022/0157248 A1* | 5/2022 | Zhang | G09G 3/3208 |
| | | | 345/215 |
| 2022/0246087 A1* | 8/2022 | Kim | H10K 59/1216 |
| 2022/0310757 A1* | 9/2022 | Li | H01L 27/1214 |
| 2022/0416008 A1* | 12/2022 | Hirose | H10K 59/131 |
| 2023/0063341 A1* | 3/2023 | Ouyang | G09G 3/3233 |

FOREIGN PATENT DOCUMENTS

| | | |
|---|---|---|
| CN | 110277060 A | 9/2019 |
| CN | 113196160 A | 7/2021 |
| CN | 114530495 A | 5/2022 |

\* cited by examiner

DISPLAY PANEL AND DISPLAY DEVICE

CROSS-REFERENCE TO RELATED APPLICATION(S)

This application claims priority to Chinese Patent Application No. 202210773012.2 filed Jun. 30, 2022, the disclosure of which is incorporated herein by reference in its entirety.

TECHNICAL FIELD

The present disclosure relates to the technical field of display and, in particular, to a display panel and a display device.

BACKGROUND

A micro light-emitting diode (Mic-LED) is a type of tiny light-emitting diode (LED) and includes a Micro-LED and a Mini-LED with chip sizes between tens of microns and hundreds of microns. Due to a small size of the micro light-emitting diode, an integrated high-density LED array can be achieved, and the integrated high-density LED array is applied to the backlight or the display.

Micro light-emitting diode displays are generally divided into two types: passive drive (PM) and active drive (AM). In the passive drive, the micro light-emitting diode is driven to emit light through directly inputting current by a driver chip. In the active drive, the micro light-emitting diode is driven to emit light in a row-column scanning manner through designing a driver circuit on a panel. Compared with the passive drive, the active drive has the advantages of higher subarea, low drive cost, support of large size, ultra-thinness and the like. However, when an active drive manner is adopted for displaying in the related art, the problem of high power consumption exists.

SUMMARY

The present disclosure provides a display panel and a display device, so as to reduce the power consumption.

According to an aspect of the present disclosure, a display panel is provided. The display panel includes a pixel driver circuit. The pixel driver circuit includes a light-emitting module, a drive transistor and at least one light-emitting control transistor. The drive transistor, the light-emitting control transistor and the light-emitting module are connected in series between a first power supply signal terminal and a second power supply signal terminal. The drive transistor is configured to drive the light-emitting module to emit light in a light-emitting stage. The light-emitting control transistor is configured to provide drive current generated by the drive transistor to the light-emitting module in the light-emitting stage. At least one of the drive transistor or the light-emitting control transistor is a first double-gate transistor. The first double-gate transistor includes a first gate, a second gate and a first source, and the second gate is electrically connected to the first source.

According to another aspect of the present disclosure, a display device is provided. The display device includes the display panel described in the first aspect.

BRIEF DESCRIPTION OF DRAWINGS

In order to more clearly explain the technical schemes in embodiments of the present disclosure, the drawings used for describing the embodiments will be briefly introduced below. Obviously, the drawings in the following description are merely some embodiments of the present disclosure. For those of ordinary skill in the art, other drawings may also be obtained without creative labor according to these drawings.

DETAILED DESCRIPTION

In order to make those skilled in the art better understand the schemes of the present disclosure, the technical schemes in the embodiments of the present disclosure will be clearly and completely described below in conjunction with the drawings in the embodiments of the present disclosure, and it is obvious that the described embodiments are merely a part of the embodiments of the present disclosure, and not all of the embodiments. All other embodiments, which may be obtained by those of ordinary skill in the art without making any creative effort based on the embodiments in the present disclosure, shall fall within the scope of protection of the present disclosure.

It should be noted that the terms "first", "second" and the like in the description and claims and above drawings of the present disclosure are used for distinguishing between similar objects and not necessarily for describing a particular sequence or sequential order. It should be understood that data so used may be interchanged where appropriate so that the embodiments of the present disclosure described herein may be practiced in other sequences than those illustrated or described herein. Furthermore, the terms "include" and "have" and any variations thereof are intended to cover a non-exclusive inclusion, such as a process, a method, a system, an article, or an apparatus that contains a list of steps or units, and are not necessarily limited to those steps or units expressly listed, but may include other steps or units not expressly listed or inherent to such process, method, article, or apparatus.

Figure 1:
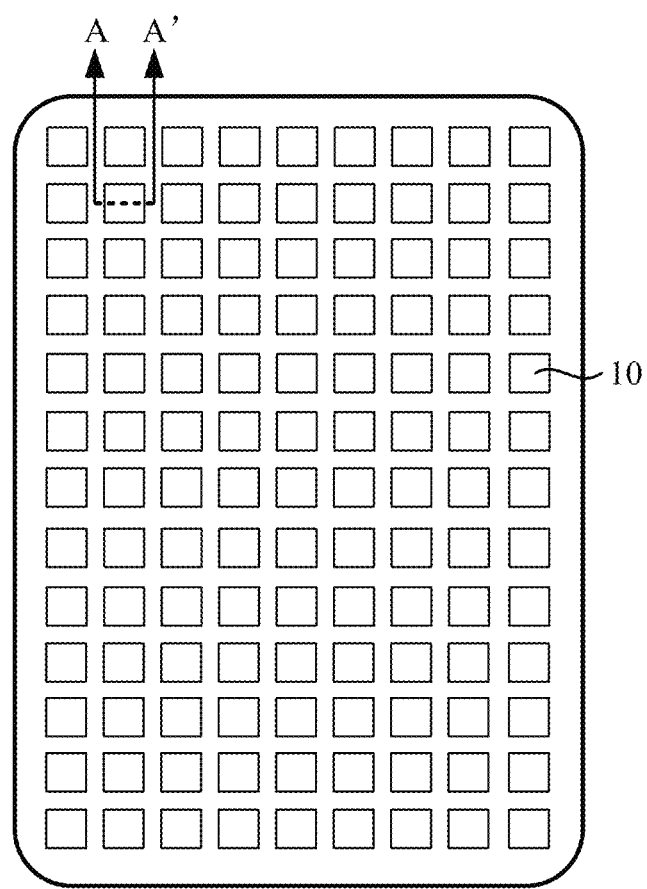
FIG. 1 is a schematic structural diagram of a display panel provided in an embodiment of the present disclosure.
Figure 2:
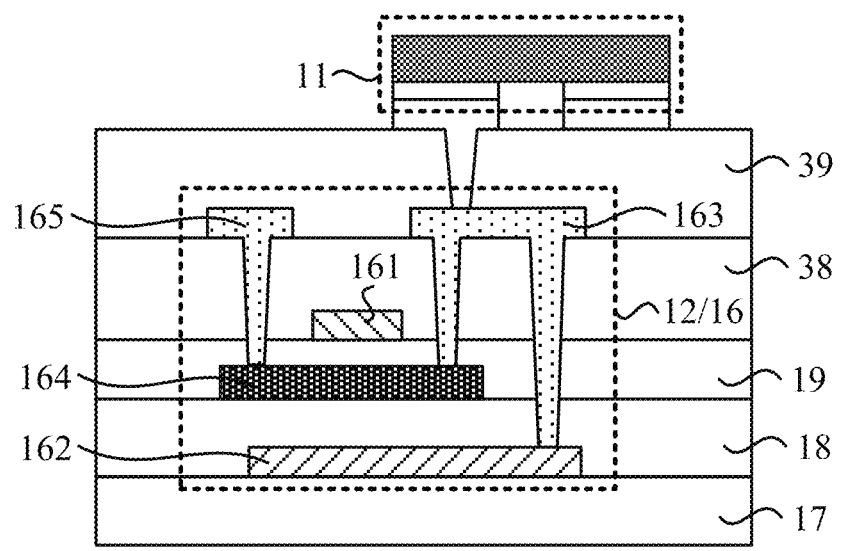
FIG. 2 is a cross-sectional diagram taken along an A-A' direction in FIG. 1.
Figure 3:
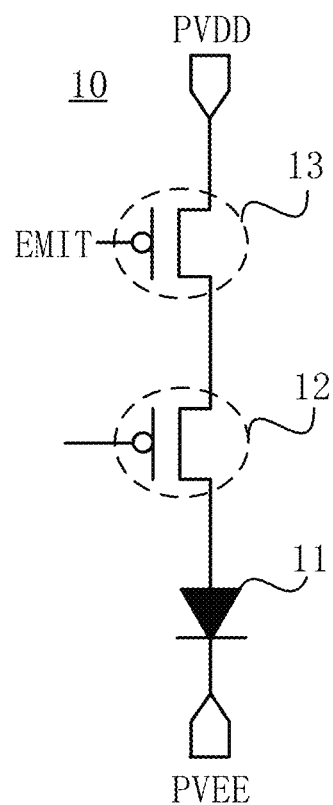
FIG. 3 is a schematic structural diagram of a pixel driver circuit provided in an embodiment of the present disclosure.

FIG. 1 is a schematic structural diagram of a display panel provided in an embodiment of the present disclosure; FIG. 2 is a cross-sectional diagram taken along an A-A' direction in FIG. 1, FIG. 3 is a schematic structural diagram of a pixel driver circuit provided in an embodiment of the present disclosure, as shown in FIGS. 1 to 3, the display panel provided in the embodiment of the present disclosure includes a pixel driver circuit 10, and the pixel driver circuit 10 includes a light-emitting module 11, a drive transistor 12 and at least one light-emitting control transistor 13. The drive transistor 12, the light-emitting control transistor 13 and the light-emitting module 11 are connected in series between a first power supply signal terminal PVDD and a second power supply signal terminal PVEE. The drive transistor 12 is configured to drive the light-emitting module 11 to emit light in a light-emitting stage, and the light-emitting control transistor 13 is configured to provide drive current generated by the drive transistor 12 to the light-emitting module 11 in the light-emitting stage. At least one of the drive transistor 12 or the light-emitting control transistor 13 is a first double-gate transistor 16, the first double-gate transistor 16 includes a first gate 161, a second gate 162 and a first source 163, and the second gate 162 is electrically connected to the first source 163.

In an embodiment, the display panel provided in the embodiment of the present disclosure is configured to emit light or display, the display panel may be directly configured to display patterns, and thus both the power consumption and the cost are low; or, the display panel may also be used as a backlight module in a liquid crystal display panel, the brightness of the light-emitting module 11 is regulated and controlled through the pixel driver circuit 10 in a partitioned manner, so that a bright-state picture of the liquid crystal display panel may have high brightness, a dark-state picture may approach zero brightness, and thus the display effect may be favorably improved.

As shown in FIG. 1 to FIG. 3, the display panel includes multiple pixel driver circuits 10 arranged in an array, in the pixel driver circuit 10, the light-emitting module 11, the drive transistor 12 and the light-emitting control transistor 13 are connected in series between the first power supply signal terminal PVDD and the second power supply signal terminal PVEE, and a voltage of the first power supply signal terminal PVDD is larger than a voltage of the second power supply signal terminal PVEE.

The light-emitting module 11 is configured to emit light in the light-emitting stage to achieve a light-emitting or display function of the display panel.

The drive transistor 12 may be turned on according to a potential of a gate of the drive transistor 12, and the drive current formed by the turned on is configured to drive the light-emitting module 11 to emit light.

The light-emitting control transistor 13 is configured to control a turned on or a turned off between the drive transistor 12 and the first power supply signal terminal PVDD, and/or configured to control the turned on or turned off between the drive transistor 12 and the second power supply signal terminal PVEE, and in FIG. 3, only the turned on or turned off between the drive transistor 12 and the first power supply signal terminal PVDD being controlled by the light-emitting control transistor 13 is used as an example, but it is not limited thereto, in other embodiments, the light-emitting control transistor 13 may be located between the drive transistor 12 and the second power supply signal terminal PVE to control the turned on or turned off between the drive transistor 12 and the second power supply signal terminal PVEE, which is not limited in the embodiments of the present disclosure.

As shown in FIG. 3, in the light-emitting stage, the light-emitting control transistor 13 is turned on, and a current path is formed from the first power supply signal terminal PVDD, the light-emitting control transistor 13, the drive transistor 12, the light-emitting module 11 to the second power supply signal terminal PVEE, so that the drive current generated by the drive transistor 12 is provided to the light-emitting module 11 to drive the light-emitting module 11 to emit light.

It should be noted that the drive transistor 12 is used as a drive tube, a gate potential of the drive transistor 12 determines a magnitude of turned-on current thereof, so that the light-emitting brightness of the light-emitting module 11 may be adjusted by controlling a gate voltage of the drive transistor 12, whereby the gray scale is controlled. The light-emitting control transistor 13 is used as a switch tube and is turned on and turned off according to a gate voltage of the light-emitting control transistor 13. As shown in FIG. 3, a gate of the light-emitting control transistor 13 is electrically connected to the light-emitting control signal terminal EMIT, so that the light-emitting control transistor 13 may be turned on or off under the control of the light-emitting control signal terminal EMIT, and in a data signal voltage writing stage, the light-emitting control transistor 13 is cut off under the control of the light-emitting control signal terminal EMIT, the drive transistor 12 is turned on, and at this time, a data signal voltage is written to its gate. In the light-emitting stage, the first light-emitting control transistor 21 is turned on in response to a light-emitting control signal provided by the light-emitting control signal terminal EMIT, so that the drive current generated by the drive transistor 12 may be transmitted to the light-emitting module 11 to drive the light-emitting module 11 to emit light.

It should be understood that in the light-emitting phase, the light-emitting control transistor 13 and the drive transistor 12 are present on the current path of the light-emitting module 11, and the light-emitting control transistor 13 and the drive transistor 12 have turned-on-resistance, so that ineffective power consumption loss is generated on the light-emitting control transistor 13 and the drive transistor 12, and the power consumption of the display panel is increased.

Figure 4:
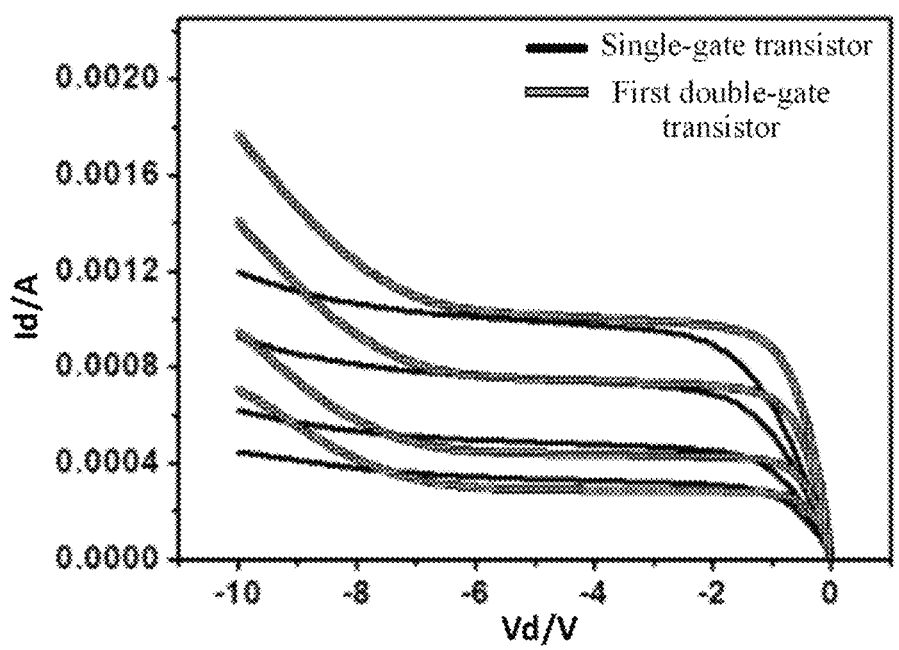
FIG. 4 is a schematic diagram of an Id-Vd curve of a transistor provided in an embodiment of the present disclosure.

With continued reference to FIGS. 1 to 3, at least one of the drive transistor 12 or the light-emitting control transistor 13 is the first double-gate transistor 16, and the second gate 162 of the first double-gate transistor 16 is electrically connected to the first source 163 of the first double-gate transistor 16. FIG. 4 is a schematic diagram of an Id-Vd curve of a transistor provided in an embodiment of the present disclosure, as shown in FIG. 4, the abscissa is a voltage Vd between the source and the drain of the transistor, the ordinate is a current Id between the source and the drain of the transistor, FIG. 4 shows Id-Vd curves for a single-gate transistor when a voltage difference Vg between its gate and source is −4V, −4.3V, −4.7V and −5V, respectively, and Id-Vd curves are shown for the first double-gate transistor 16 when a voltage difference Vg between its gate and source is −4V, −4.3V, −4.7V and −5V, respectively, and the above curves show that a cross-voltage (i.e., a voltage Vd between the source and the drain) of the first double-gate transistor 16 entering a saturation region is less than a cross-voltage of the single-gate transistor 16 entering the saturation region, whereas the power consumption of the transistor is equal to a product of its turned-on current (i.e. a current Id between the source and the drain) and the cross-voltage, the cross-voltage entering the saturation region is the smaller, the power consumption is the smaller at the same turned-on current, it can be seen that, at the same turned-on current, the power consumption of the first double-gate transistor 16 when it is turned on is less than the power consumption of the single-gate transistor when it is turned on.

Figure 5:
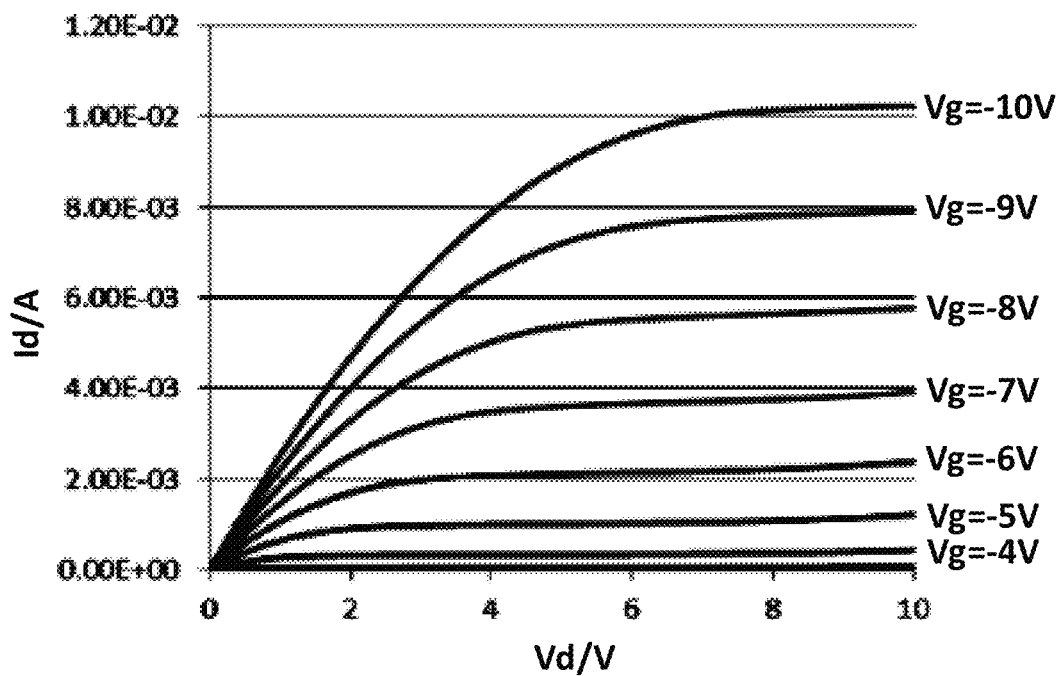
FIG. 5 is a schematic diagram of an Id-Vd curve of a single-gate transistor provided in an embodiment of the present disclosure.
Figure 6:
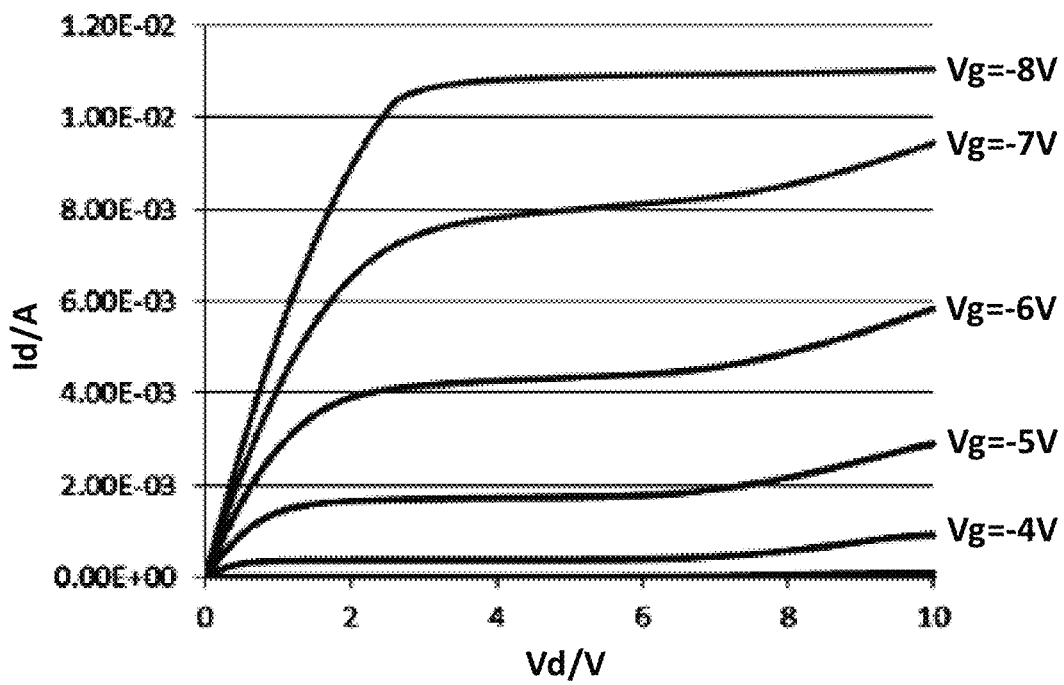
FIG. 6 is a schematic diagram of an Id-Vd curve of a first double-gate transistor provided in an embodiment of the present disclosure.
Figure 7:
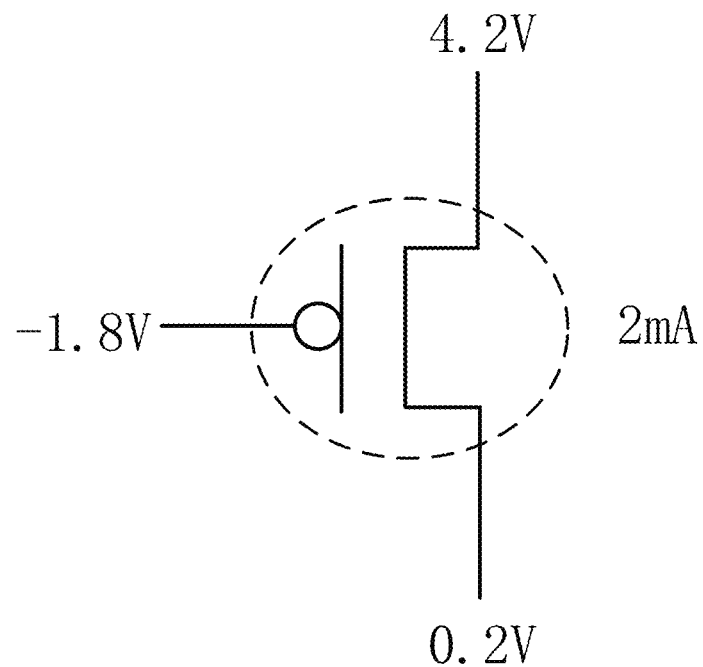
FIG. 7 is a schematic diagram of an operation state of a single-gate transistor provided in an embodiment of the present disclosure.
Figure 8:
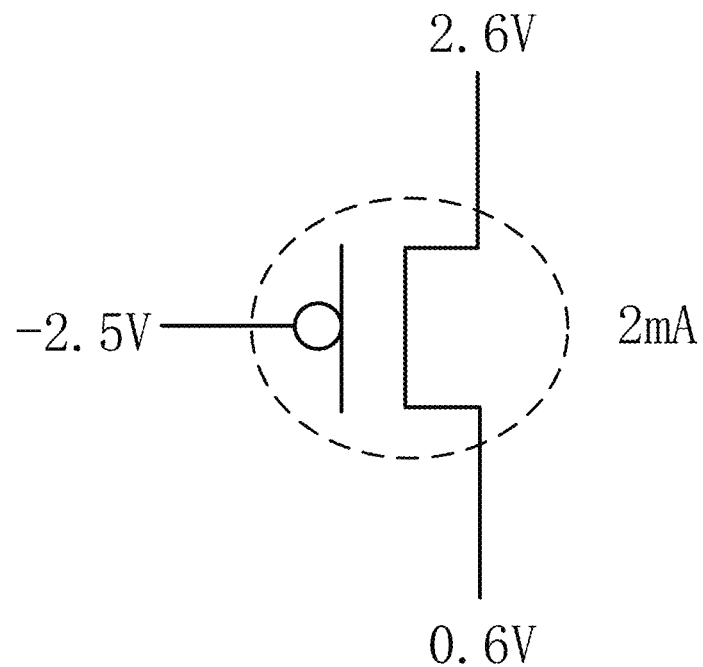
FIG. 8 is a schematic diagram of an operation state of a first double-gate transistor provided in an embodiment of the present disclosure.

In an embodiment, FIG. 5 is a schematic diagram of an Id-Vd curve of a single-gate transistor provided in an embodiment of the present disclosure, FIG. 6 is a schematic diagram of an Id-Vd curve of a first double-gate transistor provided in an embodiment of the present disclosure, FIG. 7 is a schematic diagram of an operation state of a single-gate transistor provided in an embodiment of the present disclosure, and FIG. 8 is a schematic diagram of an operation state of a first double-gate transistor provided in an embodiment of the present disclosure, FIG. 5 shows Id-Vd curves for the single-gate transistor when the voltage difference Vg between its gate and source is −10V, −9V, −8V, −7V, −6V, −5V and −4V, respectively, as shown in FIG. 5, when the turned-on current is 2 mA, a Vd of the single-gate transistor entering the saturation region is 4V. FIG. 6 shows Id-Vd curves for the first double-gate transistor when the voltage difference Vg between its gate and source is −8V, −7V, −6V, −5V and −4V, respectively, as shown in FIG. 6, when the turned-on current is 2 mA, a Vd of the first double-gate transistor entering the saturation region is 2V.

In an embodiment, as shown in FIG. 5 and FIG. 7, the turned-on current being 2 mA is used as an example, when the single-gate transistor is turned on, a source voltage is 4.2V, a gate voltage is −1.8V, and a drain voltage is 0.2 V, and at this time, a voltage difference between the gate and the source is −6V, a cross-voltage of the single-gate transistor is 4V, and the power consumption of the single-gate transistor is 2 mA*4V=8 mW.

As shown in FIG. 6 and FIG. 8, the turned-on current being 2 mA is used as an example, when the first double-gate transistor is turned on, the source voltage is 2.6V, the gate voltage is −2.5V, and the drain voltage is 0.6V, and at this time, a voltage difference between the gate and the source is about −5V, a cross-voltage of the first double-gate transistor is 2V, and the power consumption of the first double-gate transistor is 2 mA*2V=4 mW.

It may be seen that when the turned-on current is 2 mA, the cross-voltage of the first double-gate transistor is only 2V, and the cross-voltage of the single-gate transistor reaches 4V, and the power consumption of the first double-gate transistor is reduced by 50% compared with that of the single-gate transistor.

Thus, in this embodiment, at least one of the drive transistor 12 or the light-emitting control transistor 13 is set to be the first double-gate transistor 16 to which the second gate 162 and the first source 163 are electrically connected, compared with the single-gate transistor used in the related art, power consumption of the drive transistor 12 and/or the light-emitting control transistor 13 may be effectively reduced in the light-emitting stage, and therefore, the effect of reducing the power consumption of the display panel is achieved.

It should be noted that no connection is made between the gate and the source of an existing double-gate transistor, and two gates are connected at a same potential at each stage, while in this application, the second gate 162 of the first double-gate transistor 16 is electrically connected to the first source 163 of the first double-gate transistor 16, and in an actual use process, a potential on the second gate 162 will change along with a potential on the first source 163, and the potential of the first source 163 is generally positive, a subthreshold swing (SS) of the first double-gate transistor 16 may be improved by connecting the second gate 162 with the first source 163, so that the first double-gate transistor 16 has the advantage of better subthreshold swing (SS), and the subthreshold swing represents a variation of a gate voltage required by 10 times of change of a source-drain current.

It should be noted that the drive transistor 12 is used as the first double-gate transistor 16 as an example in FIG. 2, but it is not limited thereto, and it should be understood that the effect of reducing the power consumption may be achieved as long as at least one transistor on the current path of the light-emitting module 11 is configured as the first double-gate transistor 16, which may be set by those skilled in the art according to actual requirements.

In conclusion, according to the display panel provided in the embodiments of the present disclosure, the drive transistor, the light-emitting control transistor and the light-emitting module in the pixel driver circuit are connected in series between the first power supply signal terminal and the second power supply signal terminal, and at least one of the drive transistor or the light-emitting control transistor is set as the first double-gate transistor, and the second gate of the first double-gate transistor is electrically connected to the first source of the first double-gate transistor, so that the cross-voltage of the drive transistor and/or the light-emitting control transistor upon being turned on is reduced, and further, the power consumption of the drive transistor and/or the light-emitting control transistor is reduced in the light-emitting stage, and thus a problem that the power consumption of an existing display panel is large is solved.

With continued reference to FIG. 2, in an embodiment, the display panel provided in the embodiments of the present disclosure further includes a base substrate 17, the first double-gate transistor 16 is disposed on a side of the base substrate 17, the first double-gate transistor 16 further includes a first active layer 164, the first gate 161 at least partially overlaps with the first active layer 164 in a direction perpendicular to the base substrate 17, and the second gate 162 at least partially overlaps with the first active layer 164, the first gate 161 is located on a side of the first active layer 164 away from the base substrate 17, and the second gate 162 is located on a side of the first active layer 164 close to the base substrate 17; or, the second gate 162 is located on a side of the first active layer 164 away from the base substrate 17, and the first gate 161 is located on a side of the first active layer 164 close to the base substrate 17.

In an embodiment, the first double-gate transistor 16 may be prepared on a side of the base substrate 17, the first gate 161 and the second gate 162 of the first double-gate transistor 16 overlaps with the first active layer 164 in a thickness direction of the base substrate 17 to form a channel, and the first double-gate transistor 16 may be controlled to be turned on or cut off by applying different control signals to the first gate 161.

With continued reference to FIG. 2, in an embodiment, the first gate 161 is located on a side of the first active layer 164 away from the base substrate 17 as a top gate of the first double-gate transistor 16; the second gate 162 is located on a side of the first active layer 164 close to the base substrate 17 as a bottom gate of the first double-gate transistor 16. The bottom gate is electrically connected to the first source 163, and the top gate is used as a control terminal of the first double-gate transistor 16. Through the arrangement, the first double-gate transistor 16 is a double-gate transistor with the top gate and the bottom gate stacked, and thus the size of the first double-gate transistor 16 may be reduced.

Further, as shown in FIG. 2, a buffer layer 18 is disposed between the second gate 162 and the first active layer 164, and the buffer layer 18 may play a role in shock prevention, buffering and isolation. A gate insulating layer 19 is disposed between the first active layer 164 and the first gate 161, and typically, a thickness of the buffer layer 18 is greater than a thickness of the first gate 161. In this embodiment, the first gate 161 (top gate) is set as the control terminal of the first double-gate transistor 16, a distance between the first gate 161 and the first active layer 164 may be made closer to improve the control ability of the voltage on the first gate 161 to the first active layer 164 to achieve the required channel resistance and mobility.

It should be noted that positions of the first gate 161 and the second gate 162 are not limited to the above-described embodiments, which may be set by those skilled in the art according to actual requirements.

Figure 9:
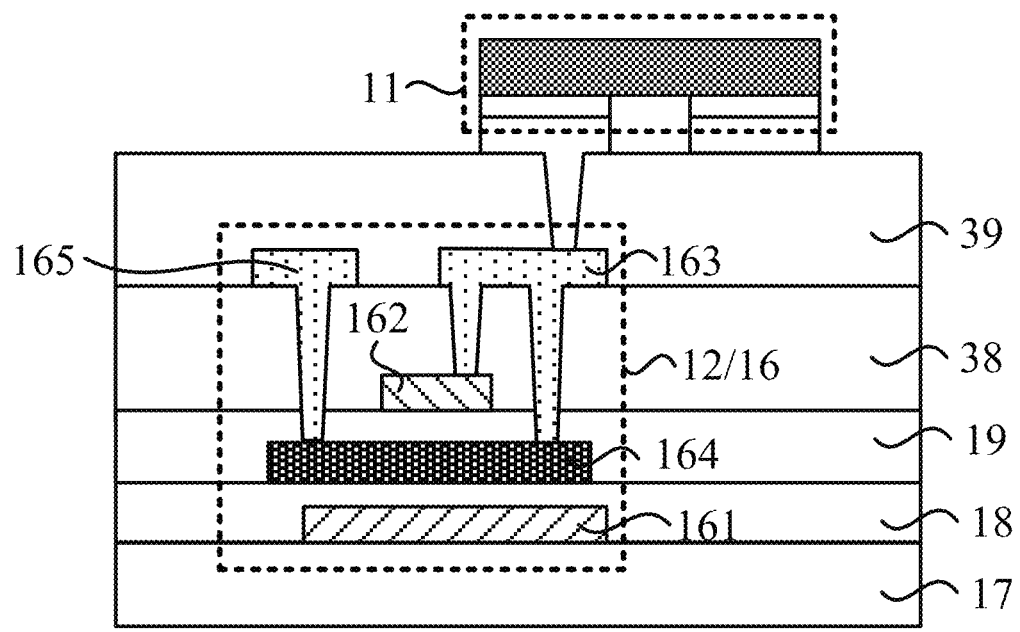
FIG. 9 is a partial cross-sectional diagram of a display panel provided in an embodiment of the present disclosure.

FIG. 9 is a partial cross-sectional diagram of a display panel provided in an embodiment of the present disclosure, as shown in FIG. 9, the second gate 162 is located on a side of the first active layer 164 away from the base substrate 17 as the top gate of the first double-gate transistor 16; the first gate 161 is located on a side of the first active layer 164 close to the base substrate 17 as the bottom gate of the first double-gate transistor 16. The top gate is electrically connected to the first source 163, and the bottom gate serves as the control terminal of the first double-gate transistor 16. Through the arrangement, the first double-gate transistor 16 is a double-gate transistor with the top gate and the bottom gate stacked, and the size of the first double-gate transistor 16 may be reduced. Meanwhile, a depth of a connecting via hole between the first source 163 and the second gate 162 may also be reduced, the punching difficulty is reduced, and it is easy to implement.

It should be noted that a specific structure of the first double-gate transistor 16 is not limited to the first gate 161, the second gate 162, the first source 163, and the first active layer 164, as shown in FIG. 2 and FIG. 9, and the first double-gate transistor 16 may further include a first drain 165 to achieve the function of the transistor, which may be set by those skilled in the art according to actual requirements.

Figure 10:
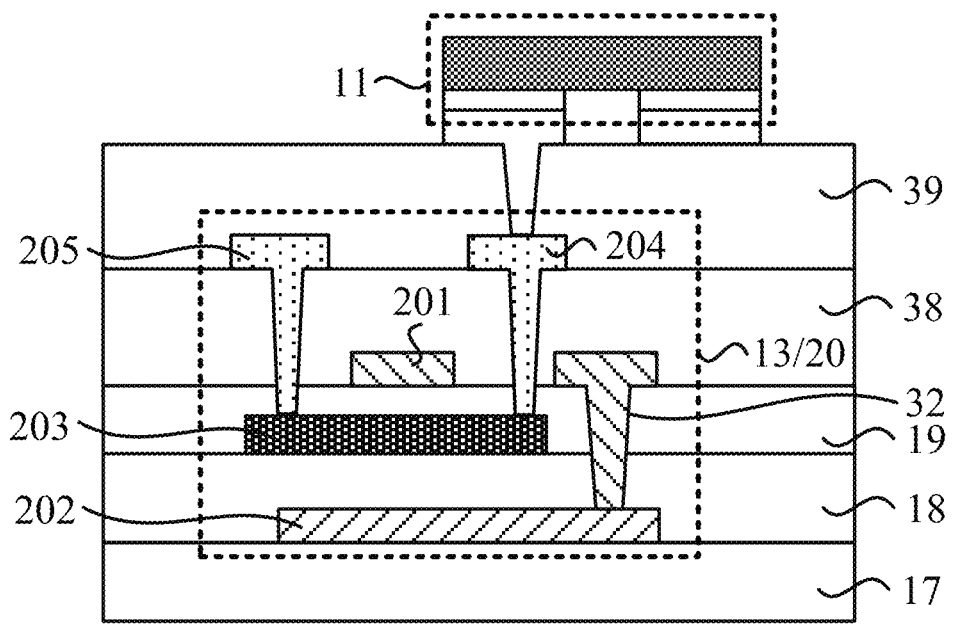
FIG. 10 is a partial cross-sectional diagram of another display panel provided in an embodiment of the present disclosure.

FIG. 10 is a partial cross-sectional diagram of another display panel provided in an embodiment of the present disclosure, as shown in FIG. 10, at least one of the drive transistor 12 or the light-emitting control transistor 13 is a second double-gate transistor 20, the second double-gate transistor 20 includes a third gate 201 and a fourth gate 202, and the third gate 201 is electrically connected to the fourth gate 202.

In an embodiment, the turned-on-resistance $R_{on}$ of the transistor satisfies the following formula:

$$R_{on} = \frac{V_{DS}}{I_{DS}} = \frac{L}{C_{ox} \cdot \mu_n \cdot W \cdot (V_{GS} - V_T - 0.5 V_{DS})}$$

$V_{DS}$ is a voltage difference between the source and the drain, $I_{DS}$ is a current between the source and the drain, L is a length of a channel, $C_{ox}$ is a capacitance of the gate insulating layer per unit area, $\mu_n$ is a carrier mobility of the transistor, VGS is a voltage difference between the gate and the source, and $V_T$ is a threshold voltage of the transistor.

From the above formula, the carrier mobility $\mu_n$ of the transistor is the higher, and the turned-on-resistance $R_{on}$ of the transistor is the smaller. In this embodiment, the second double-gate transistor 20 is provided with two gates, i.e., the third gate 201 and the fourth gate 202, and the third gate 201 and the fourth gate 202 are connected, so that compared with the single-gate transistor, the turned-on of the channel is easier, the equivalent carrier mobility $\mu_n$ is higher, the turned-on-resistance $R_{on}$ is reduced, and the power consumption of the transistor is equal to a product of the square of its turn-on current and the turn-on resistance $R_{on}$, therefore the power consumption consumed on the second double-gate transistor 20 is reduced; moreover, the carrier mobility $\mu_n$ is the higher, the turn-on current (i.e., the current $I_{DS}$ between the source and the drain) is the smaller, and thus the power consumption may be further reduced.

The measured values of the carrier mobility $\mu_n$ of the single-gate transistor and the second double-gate transistor are exemplarily given in Table 1, as shown in Table 1, the carrier mobility $\mu_n$ of the second double-gate transistor is improved by more than 10% compared with that of the single-gate transistor in a case of a same width-to-length ratio W/L and a same technological process by using a width-to-length ratio W/L as 3000/20 and 3000/5 respectively as an example, therefore, the power consumption of the second double-gate transistor may be effectively reduced.

TABLE 1 carrier mobility of the single-gate transistor and the second double-gate transistor

|  | W/L = 3000/20 | W/L = 3000/5 |
| --- | --- | --- |
| single-gate transistor | 89.2 | 78.0 |
| second double-gate transistor | 100.9 | 88.1 |

As described above, in this embodiment, at least one of the drive transistor 12 or the light-emitting control transistor 13 is set to be the second double-gate transistor 20 to which the third gate 201 and the fourth gate 202 are electrically connected, compared with the single-gate transistor used in the related art, power consumption of the drive transistor 12 and/or the light-emitting control transistor 13 may be effectively reduced in the light-emitting stage, and therefore, the effect of reducing the power consumption of the display panel is achieved.

It should be noted that an example in which only the light-emitting control transistor 13 is used as the second double-gate transistor 20 is used in FIG. 10, but it is not limited thereto, and it should be understood that the effect of reducing power consumption may be achieved as long as at least one transistor on the current path of the light-emitting module 11 is set as the second double-gate transistor 20, which may be set by those skilled in the art according to actual requirements.

It should be noted that in some embodiments, the light-emitting control transistor 13 may be set as the first double-gate transistor 16, whereby a cross-voltage of the light-emitting control transistor 13 when it enters the saturation region is reduced, since the power consumption of the transistor is equal to the product of its turned-on current and the cross-voltage, the cross-voltage entering the saturation region is the smaller, in a case of the same turned-on current, the power consumption is the smaller, whereby it can be seen that in a case of the same turned-on current, the first double-gate transistor 16 used by the light-emitting control transistor 13 can reduce the power consumption when it is turned on.

But the improvement in mobility of the first double-gate transistor 16 compared to the single-gate transistor is not significant. The light-emitting control transistor 13 is used as a switch tube and mainly works in a linear region, the light-emitting control transistor 13 may be equivalent to a resistor when working in a linear region, it should be understood that the resistance value of the resistor is the lower, the partial voltage is the lower, the consumed power consumption is the lower, and therefore, the light-emitting control transistor 13 adopts the second double-gate transistor 20 to improve the mobility, whereby the resistance of the light-emitting control transistor 13 upon being turned on is reduced, so that the power consumption of the light-emitting control transistor 13 upon being turned on is more beneficial to be reduced.

With continued reference to FIG. 10, in an embodiment, the display panel provided in the embodiments of the present disclosure further includes the base substrate 17, the second double-gate transistor 20 is disposed on a side of the base substrate 17, the second double-gate transistor 20 further includes a second active layer 203, the third gate 201 at least partially overlaps with the second active layer 203 in a direction perpendicular to the base substrate 17, and the fourth gate 20 at least partially overlaps with the second active layer 203, the third gate 201 is located on a side of the second active layer 203 away from the base substrate 17, and the fourth gate 20 is located on a side of the second active layer 203 close to the base substrate 17.

In an embodiment, the second double-gate transistor 20 may be prepared on a side of the base substrate 17, the third gate 201 and the fourth gate 202 of the second double-gate transistor 20 overlaps with the second active layer 203 in the thickness direction of the base substrate 17 to form a channel, and the second double-gate transistor 20 may be controlled to be turned on or cut off by applying different control signals to the third gate 201 and/or the fourth gate 202.

With continued reference to FIG. 2, in an embodiment, the third gate 201 is located on a side of the second active layer 203 away from the base substrate 17 as a top gate of the second double-gate transistor 20; the fourth gate 20 is located on a side of the second active layer 203 close to the base substrate 17 as a bottom gate of the second double-gate transistor 20. The third gate 201 is electrically connected to the fourth gate 20, so as to improve the carrier mobility $\mu_n$ and reduce the power consumption.

As shown in FIG. 2, a portion of the third gate 201 extending beyond the second active layer 203 may be punched downward in the thickness direction of the base substrate 17 so as to achieve an electrical connection between the third gate 201 and the fourth gate 20, but it is not limited thereto.

Moreover, the specific positions of the third gate 201 and the fourth gate 20 are not limited to the above-described embodiments, which may be set by those skilled in the art according to actual requirements.

At the same time, a specific structure of the second double-gate transistor 20 is not limited to the third gate 201, the fourth gate 202 and the second active layer 203, for example, as shown in FIG. 10, the second double-gate transistor 20 further includes a second source 204 and a second drain 205 to achieve the function of the transistor, which may be set by those skilled in the art according to actual requirements.

In an embodiment, the at least one light-emitting control transistor 13 is the second double-gate transistor 20.

The light-emitting control transistor 13 is used as a switch transistor to work in a cut-off region and a saturation region, and in the light-emitting stage, the light-emitting control transistor 13 is turned on to provide the drive current generated by the drive transistor 12 to the light-emitting module 11 so as to drive the light-emitting module 11 to emit light; and in a non-light-emitting stage, the light-emitting control transistor 13 is cut off, so that the light-emitting module 11 is prevented from being secretly lightened in the non-light-emitting stage to affect the display effect.

In this embodiment, at least one light-emitting control transistor 13 is set as the second double-gate transistor 20, the subthreshold swing (SS) of the light-emitting control transistor 13 may be made smaller while improving the carrier mobility $\mu_n$ of the light-emitting control transistor 13, reducing the turned-on-resistance $R_{on}$, and further reducing the power consumption of the light-emitting control transistor 13, the subthreshold swing represents a variation of a gate voltage required by 10 times of change of source-drain current, and the subthreshold swing is the smaller, the turned-on of the channel is the easier, and the transistor is the more sensitive, so that the turned-on speed of the light-emitting control transistor 13 may be improved, and the response capability of the light-emitting control transistor 13 is enhanced.

Meanwhile, the subthreshold swing (SS) of the light-emitting control transistor 13 is small, so that a current of the light-emitting control transistor 13 when the light-emitting control transistor 13 is cut off may be reduced, an on-off ratio of the light-emitting control transistor 13 is increased, and the power consumption of the light-emitting control transistor 13 when the light-emitting control transistor 13 is cut off is reduced, and the on-off ratio refers to a ratio between a current in a turned-on state and a current in a cut-off state.

Figure 11:
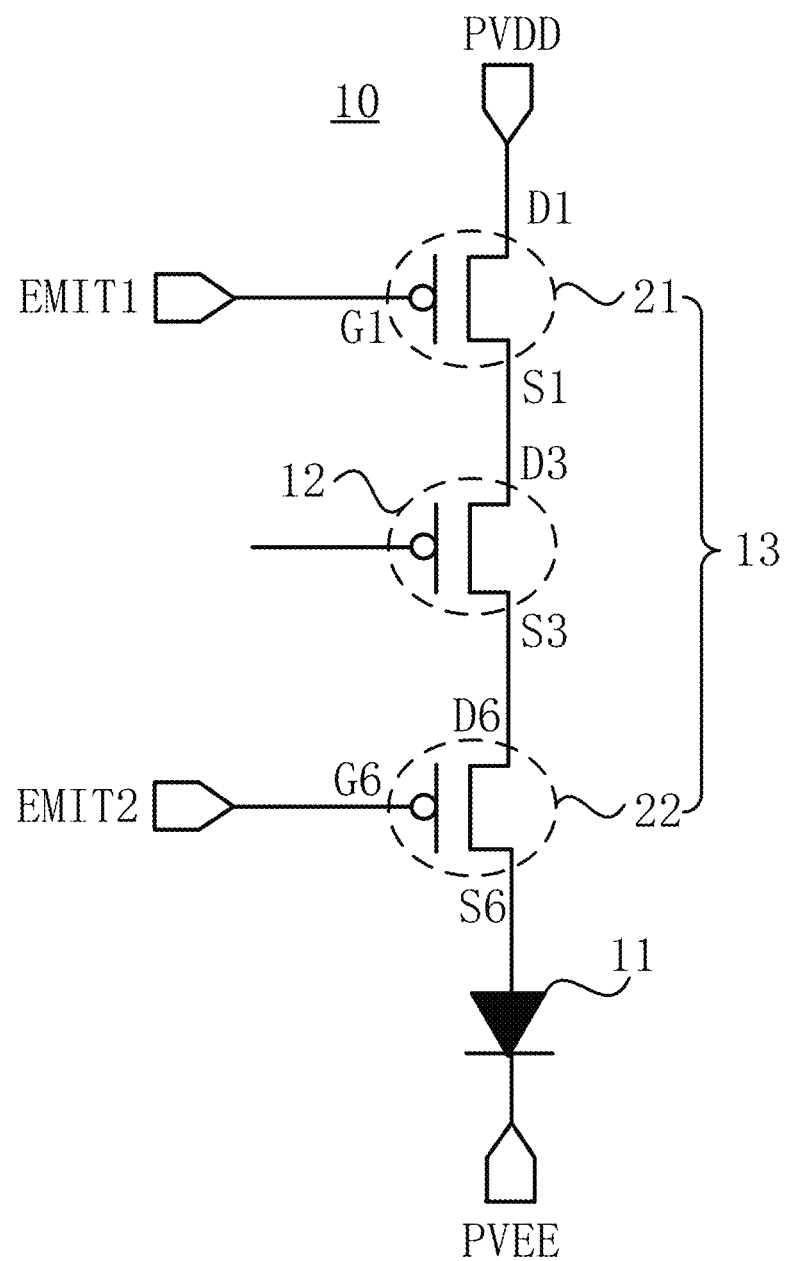
FIG. 11 is a schematic structural diagram of another pixel driver circuit provided in an embodiment of the present disclosure.

FIG. 11 is a schematic structural diagram of another pixel driver circuit provided in an embodiment of the present disclosure, as shown in FIG. 11, at least one light-emitting control transistor 13 includes a first light-emitting control transistor 21 and a second light-emitting control transistor 22, a gate G1 of the first light-emitting control transistor 21 is electrically connected to a first light-emitting control signal terminal EMIT1, and a first electrode D1 of the first light-emitting control transistor 21 is electrically connected to the first power supply signal terminal PVDD, and a second electrode S1 of the first light-emitting control transistor 21 is electrically connected to a first electrode D3 of the drive transistor 12. A gate G6 of the second light-emitting control transistor 22 is electrically connected to a second light-emitting control signal terminal EMIT2, a first electrode D6 of the second light-emitting control transistor 22 is electrically connected to a second electrode S3 of the drive transistor 12, and a second electrode S6 of the second light-emitting control transistor 22 is electrically connected to the light-emitting module 11, and the first light-emitting control transistor 21 and/or the second light-emitting control transistor 22 are the second double-gate transistor 20.

In an embodiment, as shown in FIG. 11, the first light-emitting control transistor 21 is configured to control the turned on or turned off between the drive transistor 12 and the first power supply signal terminal PVDD under the control of the first light-emitting control signal terminal EMIT1; and the second light-emitting control transistor 22 is configured to control a turned-on or a turned-off between the drive transistor 12 and the second power supply signal terminal PVEE under the control of the second light-emitting control signal terminal EMIT2. In an embodiment, in the light-emitting stage, the first light-emitting control transistor 21 is turned on in response to a light-emitting control signal provided by the first light-emitting control signal terminal EMIT1, and the second light-emitting control transistor 22 is turned on in response to a light-emitting control signal provided by the second light-emitting control signal terminal EMIT2, so as to form a current path from the first power supply signal terminal PVDD, the first light-emitting control transistor 21, the drive transistor 12, the second light-emitting control transistor 22, the light-emitting module 11 and the second power supply signal terminal PVEE, so that drive current generated by the drive transistor 12 is provided to the light-emitting module 11 to drive the light-emitting module 11 to emit light.

The first light-emitting control transistor 21 is disposed between the drive transistor 12 and the first power supply signal terminal PVDD, and the second light-emitting control transistor 22 is disposed between the drive transistor 12 and the second power supply signal terminal PVEE, so that in the non-light-emitting stage, an anode and a cathode of the drive transistor 12 are both disconnected from the power supply signal terminal, whereby the light-emitting module 11 is prevented from being secretly lightened in the non-light-emitting stage to affect the display effect.

It should be noted that the gate G1 of the first light-emitting control transistor 21 refers to a control terminal of the first light-emitting control transistor 21, for example, when the first light-emitting control transistor 21 adopts the second double-gate transistor 20, the third gate 201 and the fourth gate 202 of the second double-gate transistor 20 are used as the gate G1 of the first light-emitting control transistor 21; when the first light-emitting control transistor 21 adopts the first double-gate transistor 16, if the second gate 162 of the first double-gate transistor 16 is electrically connected to the first source 163, then the first gate 161 of the first double-gate transistor 16 serves as the gate G1 (control terminal) of the first light-emitting control transistor 21, but it is not limited thereto.

Similarly, the gate G6 of the second light-emitting control transistor 22 also refers to a control terminal of the second light-emitting control transistor 22, for example, when the second light-emitting control transistor 22 adopts the second double-gate transistor 20, the third gate 201 and the fourth gate 202 of the second double-gate transistor 20 are used as the gate G6 of the second light-emitting control transistor 22; when the first light-emitting control transistor 21 adopts the first double-gate transistor 16, if the second gate 162 of the first double-gate transistor 16 is electrically connected to the first source 163, the first gate 161 of the first double-gate transistor 16 serves as the gate G6 (control terminal) of the second light-emitting control transistor 22, but it is not limited thereto.

Figure 12:
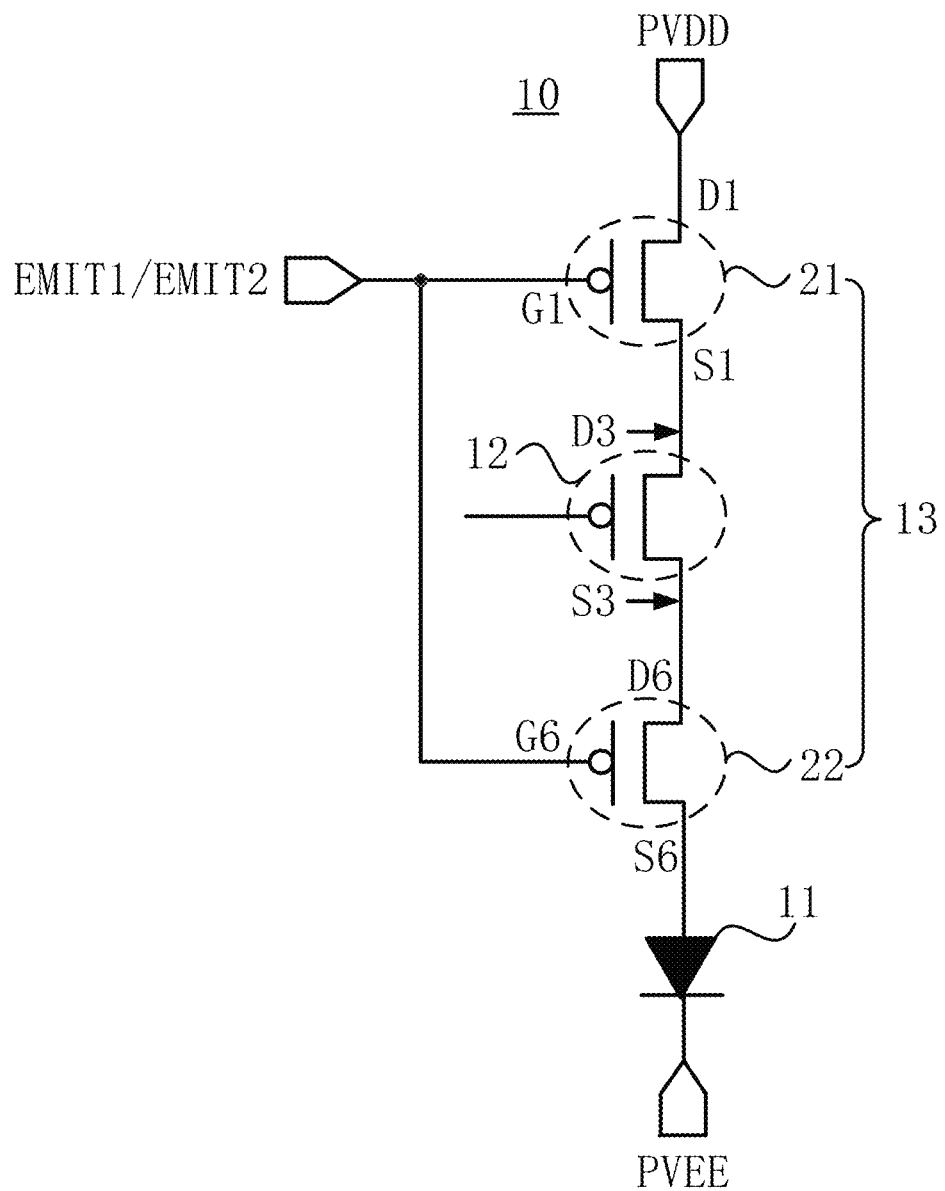
FIG. 12 is a schematic structural diagram of still another pixel driver circuit provided in an embodiment of the present disclosure.

FIG. 12 is a schematic structural diagram of still another pixel driver circuit provided in an embodiment of the present disclosure, and as shown in FIG. 12, the first light-emitting control signal terminal EMIT1 and the second light-emitting control signal terminal EMIT2 are a same control signal terminal.

As shown in FIG. 12, the first light-emitting control signal terminal EMIT1 and the second light-emitting control signal terminal EMIT2 are set to be the same control signal terminal, the first light-emitting control signal terminal EMIT1 may be multiplexed as the second light-emitting control signal terminal EMIT2, through the arrangement, a number of control signal terminals provided in the pixel driver circuit 10 may be reduced, so that the structure of the pixel driver circuit 10 is simplified, and meanwhile, a number of control signals provided to the pixel driver circuit 10 may be reduced, a structure of a scan driver circuit for providing control signals to the pixel driver circuit 10 in the display panel is simplified, the cost of the display panel is reduced, and the screen occupation ratio of the display panel is increased.

Figure 13:
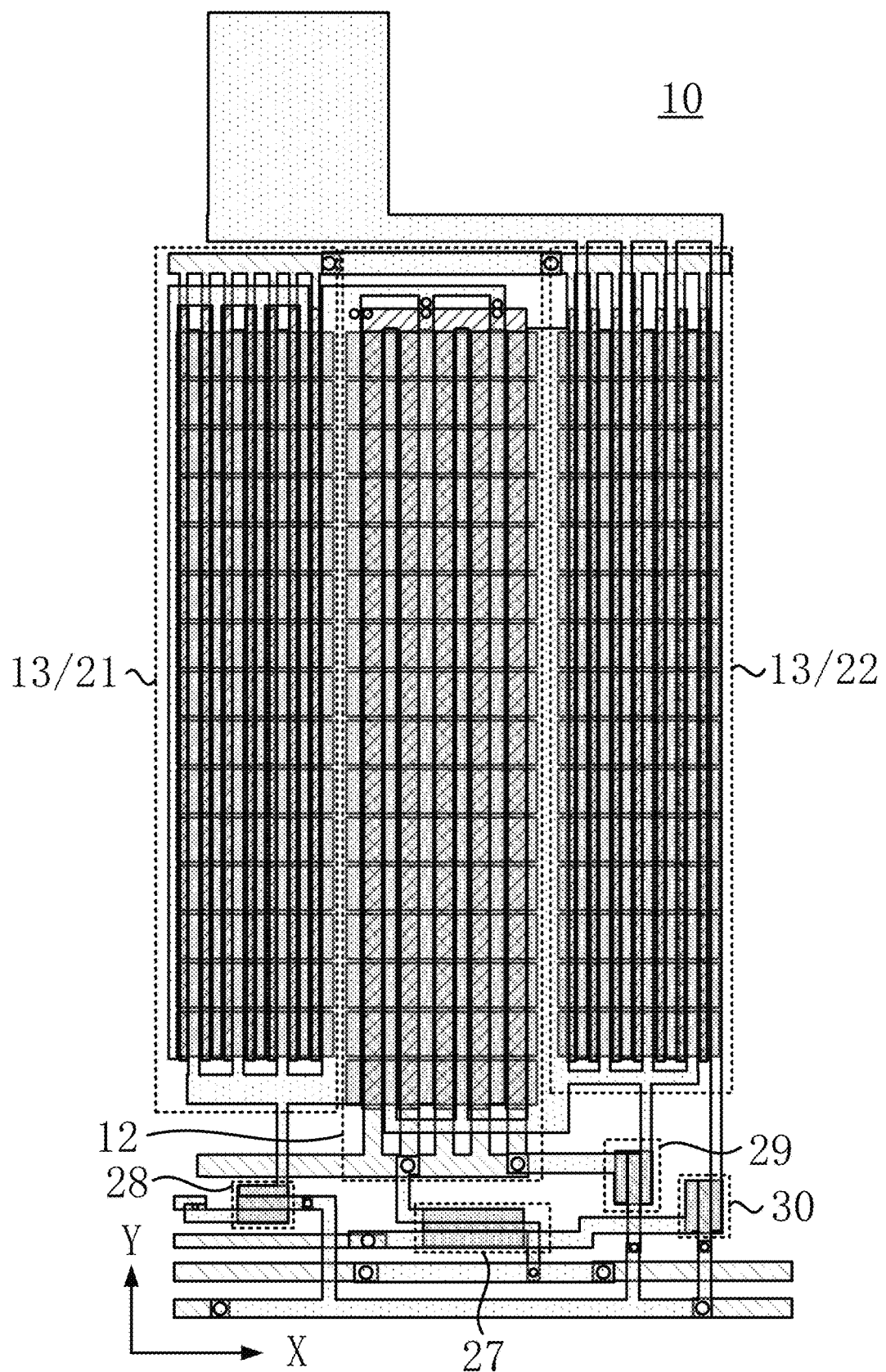
FIG. 13 is a schematic structural diagram of a partial layout of a pixel driver circuit provided in an embodiment of the present disclosure.

FIG. 13 is a schematic structural diagram of a layout of a pixel driver circuit provided in an embodiment of the present disclosure, as shown in FIG. 13, the light-emitting control transistor 13 and the drive transistor 12 are disposed adjacent to each other.

In an embodiment, in the light-emitting stage, the light-emitting control transistor 13 is turned on, and a first power supply signal provided by the first power supply signal terminal PVDD is transmitted to the light-emitting module 11 through the light-emitting control transistor 13 and the drive transistor 12, so that the drive current generated by the drive transistor 12 is provided to the light-emitting module 11 to drive the light-emitting module 11 to emit light. The light-emitting control transistor 13 and the drive transistor 12 are disposed adjacent to each other, so that the distance between the light-emitting control transistor 13 and the drive transistor 12 may be shortened, the loss of the first power supply signal during transmission between the light-emitting control transistor 13 and the drive transistor 12 is reduced, and thus the power consumption is favorably reduced.

In an embodiment, as shown in FIG. 13, the light-emitting control transistor 13 including the first light-emitting control transistor 21 and the second light-emitting control transistor 22 is used as an example, the drive transistor 12 is disposed adjacent to the first light-emitting control transistor 21 and the second light-emitting control transistor 22, respectively, so that a transmission path of a first power supply signal provided by the first power supply signal terminal PVDD sequentially passing through the first light-emitting control transistor 21, the drive transistor 12 and the second light-emitting control transistor 22 is relatively short, whereby the loss of the first power supply signal during transmission among the first light-emitting control transistor 21, the drive transistor 12 and the second light-emitting control transistor 22 is reduced, and thus the power consumption is favorably reduced.

With continued reference to FIGS. 2 and 9, in an embodiment, the drive transistor 12 is the first double-gate transistor 16.

In an embodiment, as shown in FIG. 2, FIG. 4, and FIG. 9, in this embodiment, the drive transistor 12 is set to be the first double-gate transistor 16, a cross-voltage of the first double-gate transistor 16 when entering the saturation region is reduced, whereby a larger subthreshold swing (SS) of the drive transistor 12 is also facilitated while reducing the power consumption, moreover, the drive transistor 12 controls a magnitude of the drive current according to the gate voltage thereof, the magnitude of the drive current is used for adjusting the light-emitting brightness of the light-emitting module 11, whereby the gray scale is controlled. Therefore, for the drive transistor 12, a magnitude of a drive current of each gray scale needs to be accurately controlled through the voltage of the gate, the subthreshold swing (SS) is large, the gray scale may be better defined, and the drive transistor 12 is beneficial to adjusting the displayed brightness gray scale more accurately.

In an embodiment, a length of a channel of the first double-gate transistor 16 is L1, and a width of a channel of the first double-gate transistor 16 is W1, where 3 µm≤L1≤30 µm and 10 µm≤W1≤30000 µm.

Figure 14:
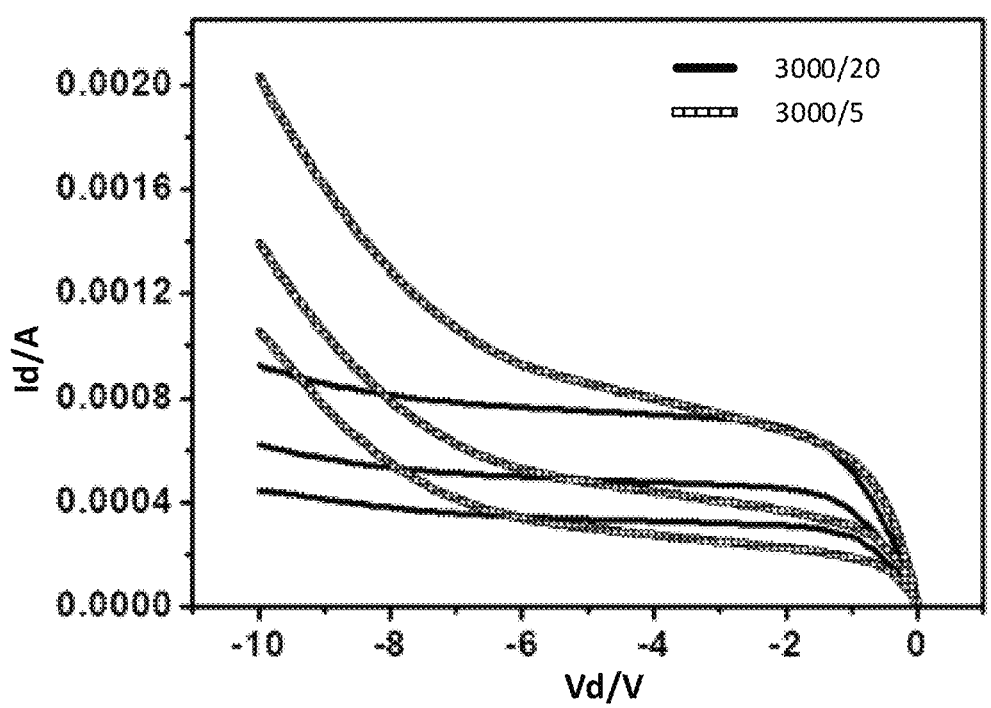
FIG. 14 is a schematic diagram of an Id-Vd curve of another single-gate transistor provided in an embodiment of the present disclosure.

In an embodiment, FIG. 14 is a schematic diagram of an Id-Vd curve of another single-gate transistor provided in an embodiment of the present disclosure, as shown in FIG. 14, the horizontal coordinate is a voltage Vd between the source and the drain of the single-gate transistor, and the vertical coordinate is a current Id between the source and the drain of the single-gate transistor, FIG. 14 shows Id-Vd curves for the single-gate transistor with a width-to-length ratio of 3000/20 when the voltage difference Vg between its gate and source is −4V, −4.3V, and −4.7V, respectively, and Id-Vd curves for the single-gate transistor with a width-to-length ratio of 3000/5 when the voltage difference Vg between its gate and source is −3.1V, −3.3V, and −3.6V, respectively, as can be seen from the above curves, a width of a channel-to-length ratio of the transistor is the larger, the cross-voltage (i.e., the voltage Vd between the source and the drain) of it entering the saturation region is the smaller, while the power consumption of the transistor is equal to a product of its turned-on current (i.e., the current Id between the source and the drain) and the cross-voltage, therefore the cross-voltage entering the saturation region is the smaller, then the power consumption is the smaller at the same turned-on current.

In this embodiment, the length L1 of the channel and the width of the channel W1 of the first double-gate transistor 16 are reasonably set, so that a width of a channel-to-length ratio of the first double-gate transistor 16 is relatively large, whereby the power consumption of the first double-gate transistor 16 is further reduced.

At the same time, as shown in FIG. 14, when a width of a channel-to-length ratio (such as, 3000/5) of the single-gate transistor is large, a kink phenomenon occurs, where Kink is a Kink effect, which refers to the non-saturation characteristics of a drain current and a drain voltage of a field-effect transistor, as shown in FIG. 14, the Kink phenomenon is that the Id-Vd curve in the saturation region is warped (not flat), and when it is applied to the drive transistor 12, a small fluctuation of the gate voltage of the drive transistor 12 will cause a drastic change of the drive current, so that a large change of the brightness of the light-emitting module 11 is caused, and further the display effect is affected. With continued reference to FIG. 4, FIG. 4 shows Id-Vd curves of the first double-gate transistor 16 with a width-to-length ratio of 3000/5 when the voltage difference Vg between the gate and the source of the first double-gate transistor 16 is −4V, −4.3V, −4.7V and −5V, respectively, and as can be seen from the above curves, when the width-to-length ratio (such as 3000/5) of the first double-gate transistor 16 is relatively large, the kink problem when the width of the channel-to-length ratio is larger may be improved, the requirement for a smooth saturation region is satisfied, whereby the stability of the saturation region is improved while the power consumption is reduced.

In an embodiment, a width of a channel-to-length ratio of the first double-gate transistor 16 is D1, and where 10/30≤D1≤30000/3.

As described above, the width of the channel-to-length ratio of the first double-gate transistor 16 is reasonably set, so that the size of the first double-gate transistor 16 may not be excessively large while reducing the power consumption of the first double-gate transistor 16, whereby the Pixels Per Inch (PPI) of the display panel is improved. Meanwhile, the structure of the first double-gate transistor 16 may improve the kink problem when the width-to-length ratio of the channel is large, and the requirement for flatness of the saturation region is satisfied, so that the stability of the saturation region is improved while the power consumption is reduced.

Figure 15:
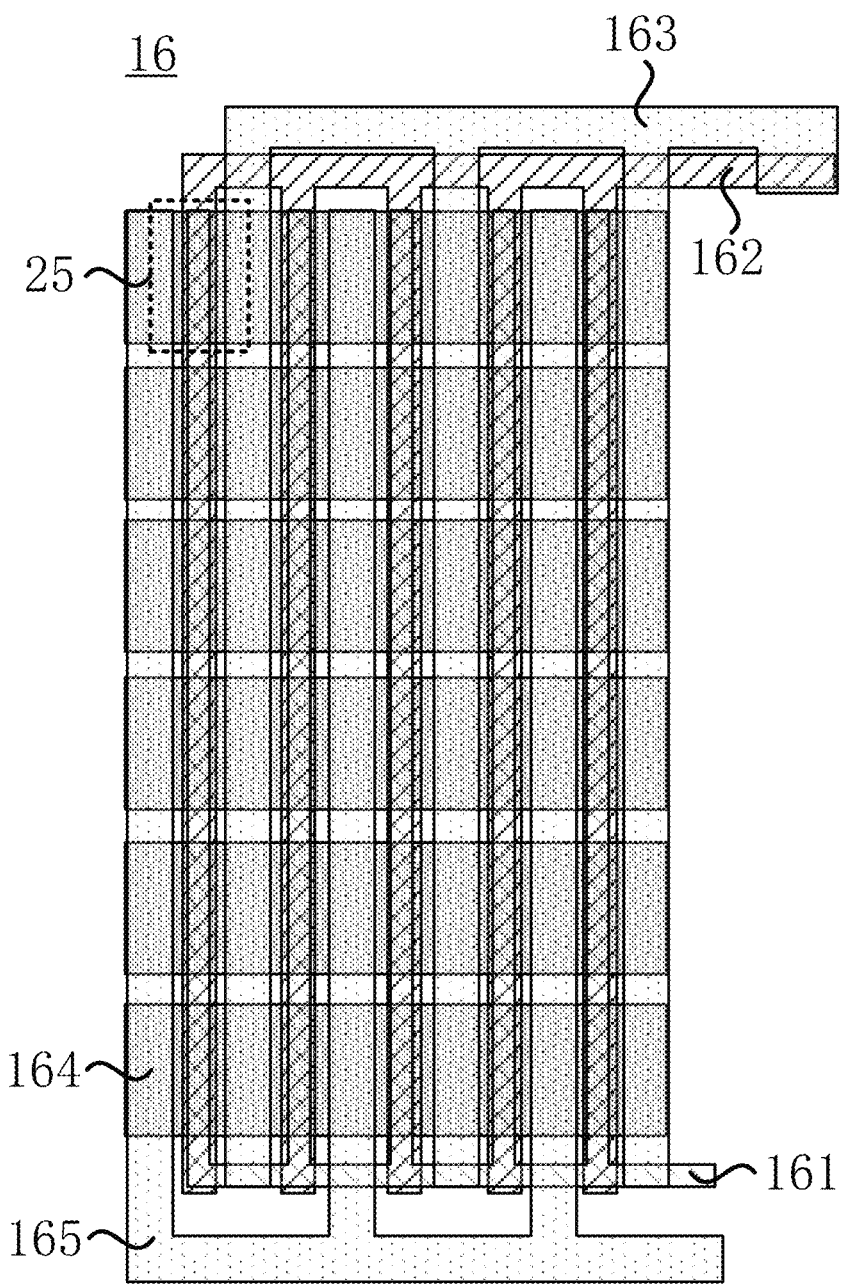
FIG. 15 is a schematic structural diagram of a first double-gate transistor provided in an embodiment of the present disclosure.

FIG. 15 is a schematic structural diagram of a first double-gate transistor provided in an embodiment of the present disclosure, as shown in FIG. 15, the first double-gate transistor 16 includes multiple first double-gate sub-transistors 25, and the multiple first double-gate sub-transistors 25 are connected in parallel.

In an embodiment, the first double-gate transistor 16 is formed by connecting the multiple first double-gate sub-transistors 25 in parallel, and structures of the multiple first double-gate sub-transistors 25 may be the same or different. As shown in FIG. 15, the same structure of the multiple first double-gate sub-transistors 25 is used as an example, the sources of the multiple first double-gate sub-transistors 25 are electrically connected to form the first source 163 of the first double-gate transistor 16; drains of the multiple first double-gate sub-transistors 25 are electrically connected to form the first drain 165 of the first double-gate transistor 16; the active layers of the multiple first double-gate sub-transistors 25 are electrically connected to form the first active layer 164 of the first double-gate transistor 16; top gates of the multiple first double-gate sub-transistors 25 are electrically connected to form the first gate 161 of the first double-gate transistor 16, and bottom gates of the multiple first double-gate sub-transistors 25 are electrically connected to form the second gate 162 of the first double-gate transistor 16.

The first double-gate transistor 16 is formed by disposing the first double-gate sub-transistors 25 of a smaller tube type in parallel, so that the influence caused by a preparation process may be reduced, the difference between different first double-gate transistors 16 is reduced, the uniformity of the first double-gate transistors 16 is improved, and thus the display uniformity of the display panel is improved.

It should be noted that a number of the first double-gate sub-transistors 25 in each first double-gate transistor 16 may be set according to actual requirements, which may be set by those skilled in the art according to actual requirements, for example, the width of the channel-to-length ratio of the first double-gate transistor 16 being 3000/20 is used as an example, which may be formed by connecting the 10 first double-gate sub-transistors 25 with the width of the channel-to-length ratio of 300/20 in parallel, and also by connecting the 20 first double-gate sub-transistors 25 with the width of the channel-to-length ratio of 150/20 in parallel, which is not limited in the embodiments of the present disclosure.

In an embodiment, a length of a channel of the second double-gate transistor 20 is L2, and a width of a channel of the second double-gate transistor 20 is W2, where 3 µm≤L2≤30 µm, and 10 µm≤W2≤30000 µm.

As described above, the length L2 of the channel and the width of the channel W2 of the second double-gate transistor 20 are reasonably set, so that a width of a channel-to-length ratio of the second double-gate transistor 20 is relatively large, whereby the power consumption of the second double-gate transistor 20 is further reduced.

In an embodiment, a width of a channel-to-length ratio of the second double-gate transistor 20 is D2, and 10/30≤D2≤30000/3.

The width of the channel-to-length ratio of the second double-gate transistor 20 is reasonably set, so that the size of the second double-gate transistor 20 may not be excessively large while reducing the power consumption of the second double-gate transistor 20, whereby the pixel density of the display panel is improved.

Figure 16:
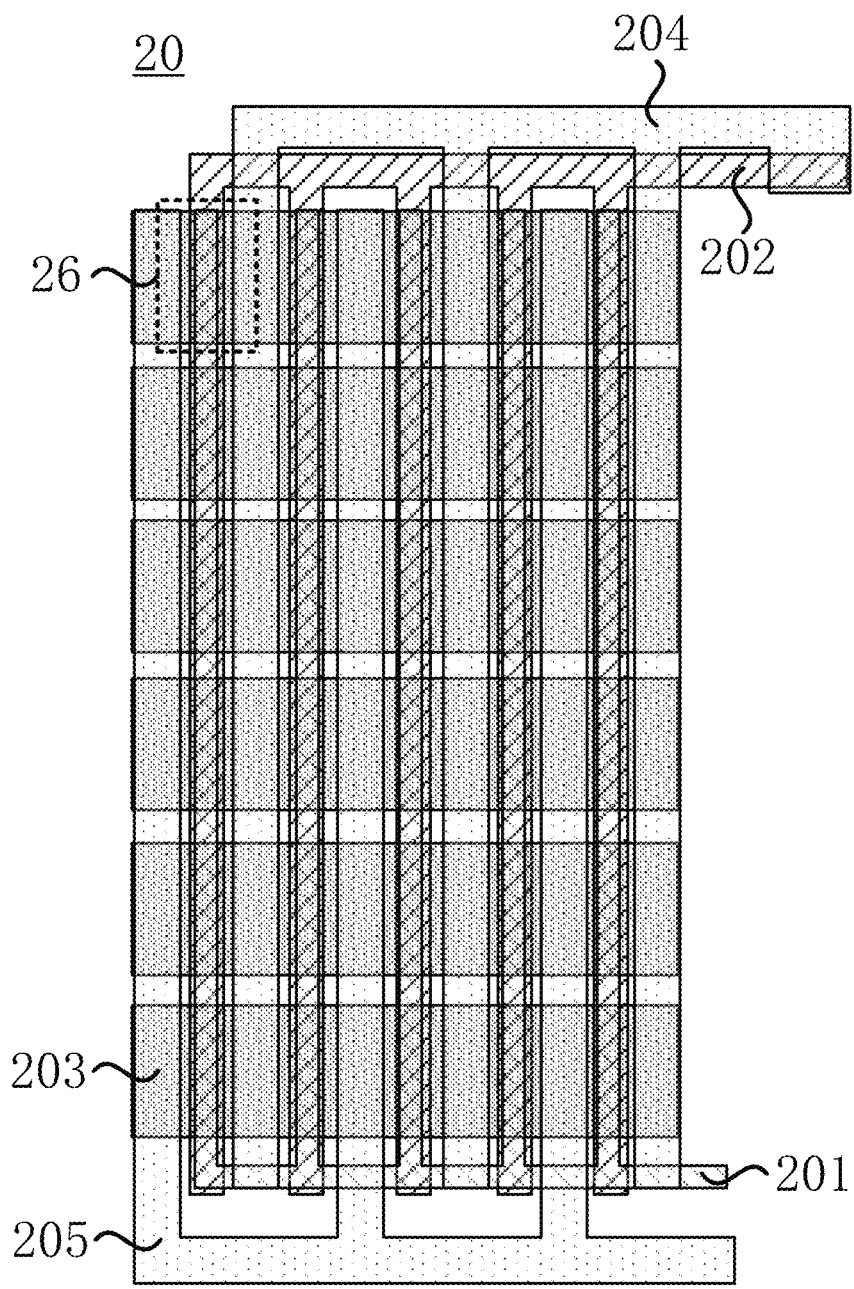
FIG. 16 is a schematic structural diagram of a second double-gate transistor provided in an embodiment of the present disclosure.

FIG. 16 is a schematic structural diagram of a second double-gate transistor provided in an embodiment of the present disclosure, as shown in FIG. 16, the second double-gate transistor 20 includes multiple second double-gate sub-transistors 26, and the multiple second double-gate sub-transistors 26 are connected in parallel.

In an embodiment, the second double-gate transistor 20 is formed by connecting the multiple second double-gate sub-transistors 26 in parallel, and structures of the multiple second double-gate sub-transistors 26 may be the same or different. As shown in FIG. 16, the same structure of the multiple second double-gate sub-transistors 26 is used as an example, the sources of the multiple second double-gate sub-transistors 26 are electrically connected to form the second source 204 of the second double-gate sub-transistors 20; drains of the multiple second double-gate sub-transistors 26 are electrically connected to form the second drain 205 of the second double-gate transistor 20; the active layers of the multiple second double-gate sub-transistors 26 are electrically connected to form the second active layer 203 of the second double-gate transistor 20; top gates of the multiple second double-gate sub-transistors 26 are electrically connected to form the third gate 201 of the second double-gate transistor 20; and bottom gates of the multiple second double-gate sub-transistors 26 are electrically connected to form the fourth gate 202 of the second double-gate transistor 20.

The second double-gate transistor 20 is formed by disposing the second double-gate sub-transistors 26 of a smaller tube type in parallel, so that the influence caused by the preparation process may be reduced, the difference between different second double-gate transistors 20 is reduced, the uniformity of the second double-gate transistors 20 is improved, and thus the display uniformity of the display panel is improved.

It should be noted that a number of the second double-gate sub-transistors 26 in each second double-gate transistor 20 may be set according to actual requirements, which may be set by those skilled in the art according to actual requirements, for example, the width of the channel-to-length ratio of the second double-gate transistor 20 being 3000/20 is used as an example, which may be formed by connecting the 10 second double-gate sub-transistors 26 with the width of the channel-to-length ratio of 300/20 in parallel, and also by connecting the 20 second double-gate sub-transistors 26 with the width of the channel-to-length ratio of 150/20 in parallel, which is not limited in the embodiments of the present disclosure.

In an embodiment, the light-emitting module 11 includes a light-emitting diode.

The light-emitting diode may be a micro light-emitting diode (Micro-LED), the micro light-emitting diode may adopt Micro-LED and Mini-LED. The Micro-LED refers to an LED chip with a grain size of less than 100 microns, a display screen capable of having 0.05 mm or smaller pixel particles, and the Micro-LED is low in power consumption and has good material stability and no image residue. The Mini-LED refers to an LED chip with the grain size ranging from 100 microns to 1000 microns, when the Mini-LED is adopted, the yield is high, the special-shaped cutting characteristic is achieved, a high-curved-surface backlight form can also be formed by being matched with a soft base substrate, and the better color rendering performance is achieved.

In other embodiments, the light-emitting diode may be an organic light-emitting diode (OLED), the organic light-emitting diode has the advantages of simple construction, high response, high contrast ratio, flexibility, wide viewing angle, and the like, but is not limited thereto, which may be set by those skilled in the art according to actual requirements.

Figure 17:
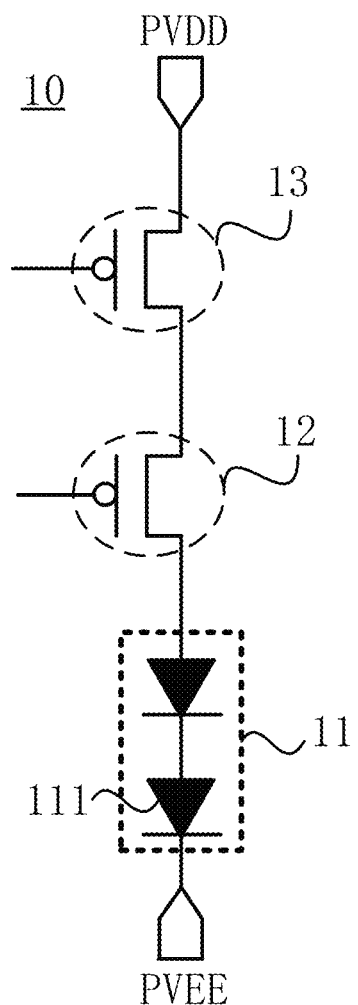
FIG. 17 is a schematic structural diagram of still another pixel driver circuit provided in an embodiment of the present disclosure.
Figure 18:
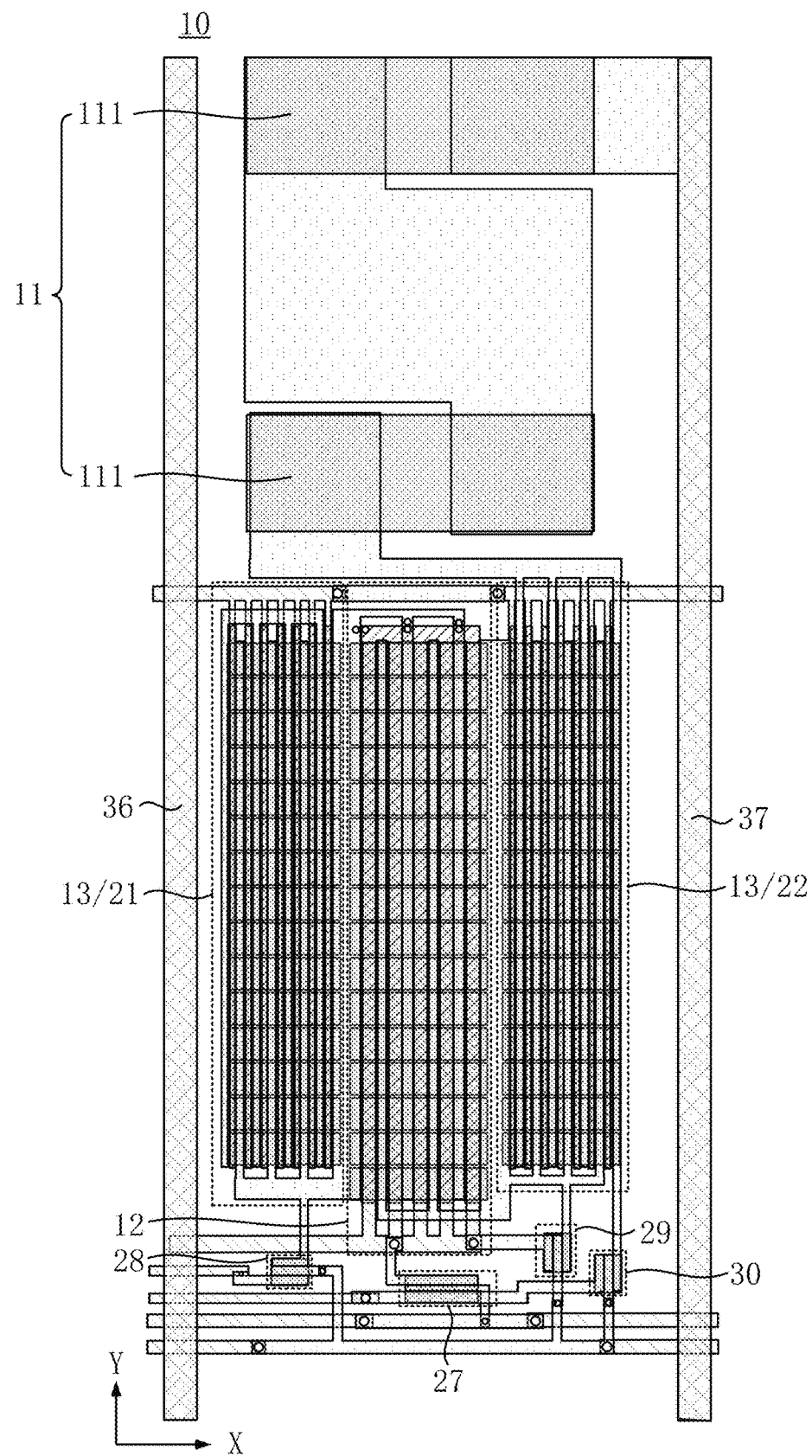
FIG. 18 is a schematic structural diagram of a partial layout of another pixel driver circuit provided in an embodiment of the present disclosure.

FIG. 17 is a schematic structural diagram of still another pixel driver circuit provided in an embodiment of the present disclosure, and FIG. 18 is a schematic structural diagram of a partial layout of another pixel driver circuit provided in an embodiment of the present disclosure, as shown in FIG. 17 and FIG. 18, the light-emitting module 11 includes at least two light-emitting diodes 111 connected in series or in parallel.

In an embodiment, as shown in FIG. 17 and FIG. 18, the at least two light-emitting diodes 111 are connected in series, the current of the light-emitting module 11 may be reduced, whereby the power consumption of the light-emitting module 11 is reduced, but it is not limited thereto.

With continued reference to FIG. 18, the light-emitting module 11 including two light-emitting diodes 111 is used as an example, a connection line of an anode and a cathode of the light-emitting diode 111 extend in a first direction X, and the two light-emitting diodes 111 are arranged in a second direction Y, through the arrangement, so that anodes of the two light-emitting diodes 111 are located in the same direction of the cathodes (the anodes are located on the left side and the cathodes are located on the right side in the drawings). Therefore, when the light-emitting diodes 111 are printed, part of the light-emitting diodes 111 do not need to be overturned, the technological process may be saved, and thus the batch production is facilitated.

At the same time, the connection line between the two light-emitting diodes 111 may be disposed in an S-shape, and the size of the light-emitting module 11 may be reduced compared with the two light-emitting diodes 111 linearly arranged in the first direction X, whereby the pixel density is favorably improved.

Figure 19:
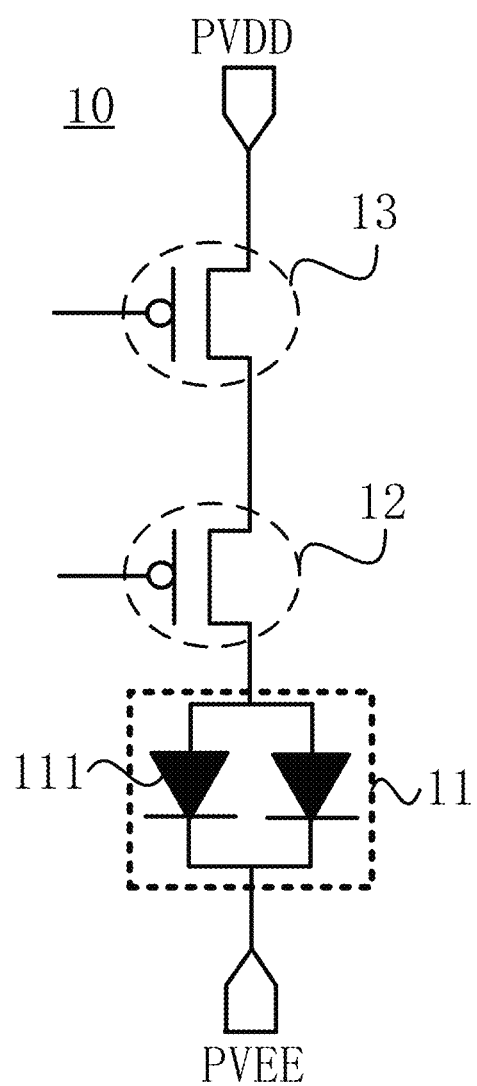
FIG. 19 is a schematic structural diagram of still another pixel driver circuit provided in an embodiment of the present disclosure.

FIG. 19 is a schematic structural diagram of still another pixel driver circuit provided in an embodiment of the present disclosure, as shown in FIG. 19, at least two light-emitting diodes 111 may set to be connected in parallel to reduce the cross-voltage of the light-emitting module 11, whereby the power consumption of the light-emitting module 11 is reduced.

Figure 20:
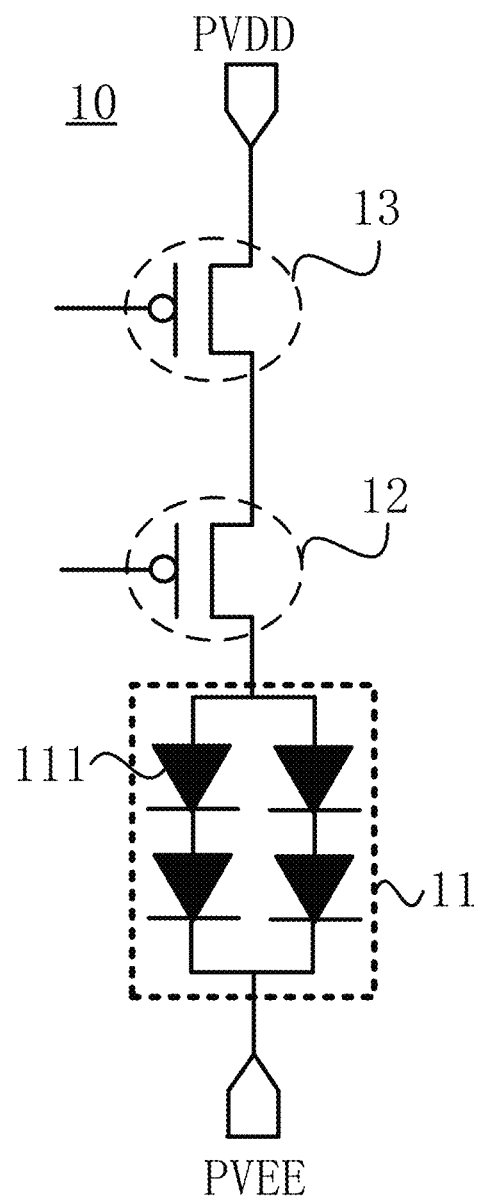
FIG. 20 is a schematic structural diagram of still another pixel driver circuit provided in an embodiment of the present disclosure.

FIG. 20 is a schematic structural diagram of still another pixel driver circuit provided in an embodiment of the present disclosure, as shown in FIG. 20, at least two light-emitting diodes 111 may be set to be connected in series and parallel so as to reduce the current and cross-voltage of the light-emitting module 11 at the same time, whereby the power consumption of the light-emitting module 11 is reduced, which may be set by those skilled in the art according to actual requirements.

It should be noted that a connection manner and a number of light-emitting diodes 111 in each light-emitting module 11 may be set according to actual requirements, for example, the number of light-emitting diodes 111 in each light-emitting module 11 may be 1, 2, 3 or 4, and the connection manner may be series, parallel or series-parallel, which is not limited in the embodiments of the present disclosure.

Figure 21:
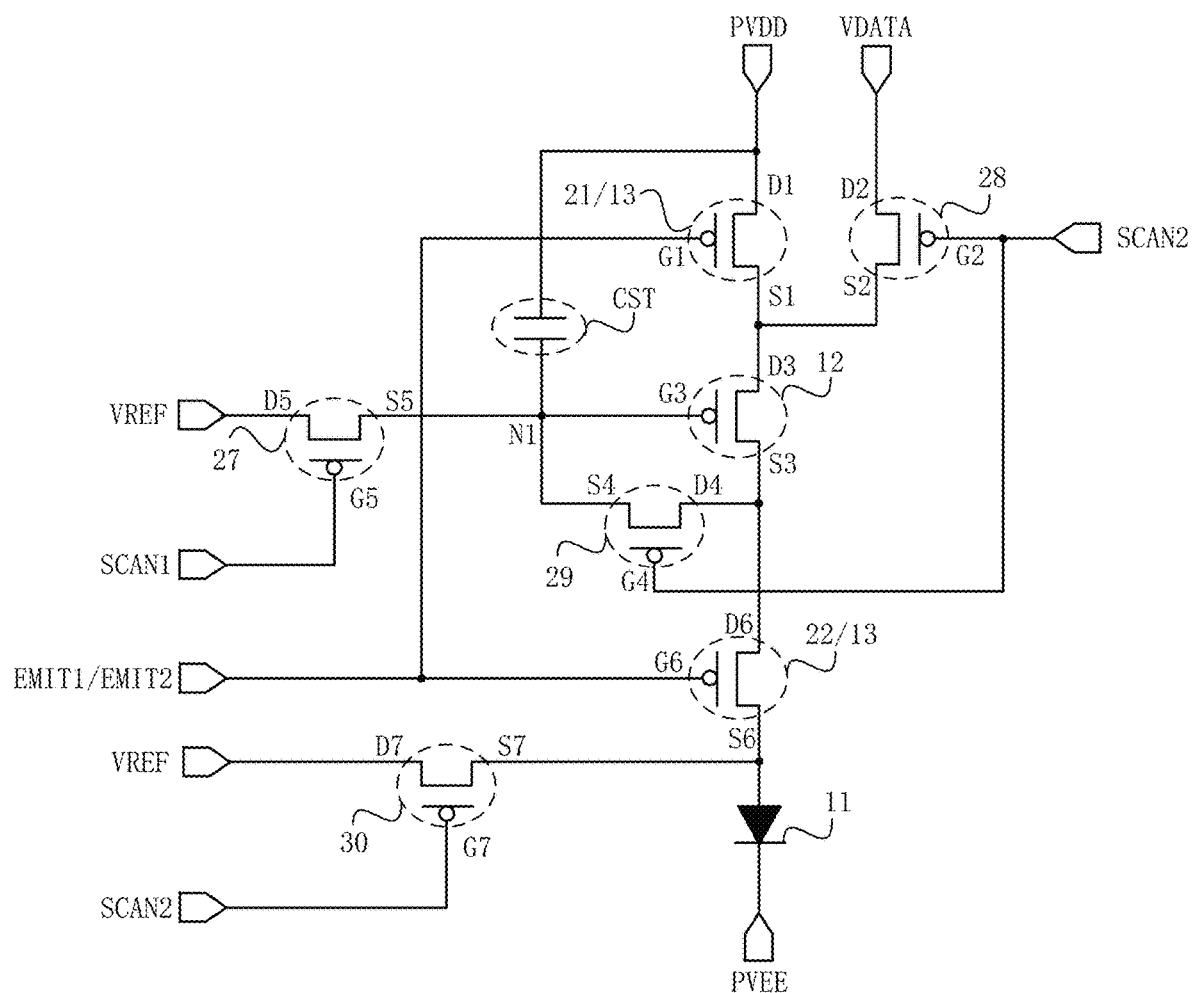
FIG. 21 is a schematic structural diagram of still another pixel driver circuit provided in an embodiment of the present disclosure.

FIG. 21 is a schematic structural diagram of still another pixel driver circuit provided in an embodiment of the present disclosure, as shown in FIG. 13, FIG. 18, and FIG. 21, and the pixel driver circuit 10 further includes a first reset transistor 27, a data writing transistor 28, an additional transistor 29, a first capacitor CST and a light-emitting reset transistor 30.

A gate G5 of the first reset transistor 27 is electrically connected to a first scan signal terminal SCAN1, a first electrode D5 of the first reset transistor 27 is electrically connected to a reference signal terminal VREF, and a second electrode S5 of the first reset transistor 27 and a gate G3 of the drive transistor 12 are connected to a first node N1.

A gate G2 of the data writing transistor 28 is electrically connected to a second scan signal terminal SCAN2, a first electrode D2 of the data writing transistor 28 is electrically connected to a data signal terminal VDATA, and a second electrode S2 of the data writing transistor 28 is electrically connected to a first electrode D3 of the drive transistor 12.

A gate G4 of the additional transistor 29 is electrically connected to the second scan signal terminal SCAN2, a first electrode D4 of the additional transistor 29 is electrically connected to a second electrode S3 of the drive transistor 12, and a second electrode S4 of the additional transistor 29 is electrically connected to the first node N1.

One end of the first capacitor CST is electrically connected to the first power supply signal terminal PVDD, and another end of the first capacitor CST is electrically connected to the first node N1.

A gate G7 of the light-emitting reset transistor 30 is connected to the second scan signal terminal SCAN2, a first electrode D7 of the light-emitting reset transistor 30 is electrically connected to the reference signal terminal VREF, and a second electrode S7 of the light-emitting reset transistor 30 is electrically connected to the light-emitting module 11.

In an embodiment, a driving process of the pixel driver circuit 10 shown in FIG. 13, FIG. 18, and FIG. 21 is, for example the following.

In an initialization stage, a first scan signal on a first scan signal terminal SCAN1 enables a first reset transistor 27 to be turned on, a reference voltage on the reference signal terminal VREF is applied to an end of the first capacitor CST through the first reset transistor 27, that is, a potential of the first node N1 is the reference voltage to reset the first node N1, and at this time, a potential of the gate G3 of the drive transistor 12 is also the reference voltage.

In the data signal voltage writing stage, a second scan signal on the second scan signal terminal SCAN2 enables the data writing transistor 28 and the additional transistor 29 to be turned on, at this time, a potential of the gate G3 of the drive transistor 12 is the reference voltage, the drive transistor 12 is also turned on, and a data signal voltage on the data signal terminal VDATA is applied to the first node N1 through the data writing transistor 28, the drive transistor 12 and the additional transistor 29, so that the data signal voltage is written into the first capacitor CST.

Meanwhile, in the data signal voltage writing stage, the second scan signal on the second scan signal terminal SCAN2 enables the light-emitting reset transistor 30 to be turned on, the light-emitting reset transistor 30 writes a reference voltage on the reference signal terminal VREF into the anode of the light-emitting module 11, an anode potential of the light-emitting module 11 is reset, and the voltage of the light-emitting module 11 is reset. The influence of an anode voltage of the light-emitting module 11 of the previous frame on an anode voltage of the light-emitting module 11 of the next frame may be reduced, and the display uniformity is further improved.

In the light-emitting stage, light-emitting control signals on the first light-emitting control signal terminal EMIT1/the second light-emitting control signal terminal EMIT2 enable the first light-emitting control transistor 21 and the second light-emitting control transistor 22 to be turned on, so that the drive transistor 12 drives the light-emitting module 11 to emit light, and light-emitting and display functions of the display panel are achieved.

It should be noted that the gate G3 of the drive transistor 12 refers to its control terminal, for example, when the drive transistor 12 adopts the second double-gate transistor 20, the third gate 201 and the fourth gate 202 of the second double-gate transistor 20 serve as the gate G3 of the drive transistor 12; however, when the first light-emitting control transistor 21 adopts the first double-gate transistor 16, if the second gate 162 thereof is electrically connected to the first source 163, then the first gate 161 is used as the gate G3 (control terminal) of the drive transistor 12, but it is not limited thereto.

Moreover, in the above embodiments, each transistor may be a P-type transistor or an N-type transistor; or part of the transistors are the P-type transistor, and part of the transistors are the N-type transistor; in other embodiments, the transistor may also be a complementary metal oxide semiconductor (CMOS) transistor, which is not limited in the embodiments of the present disclosure.

Figure 22:
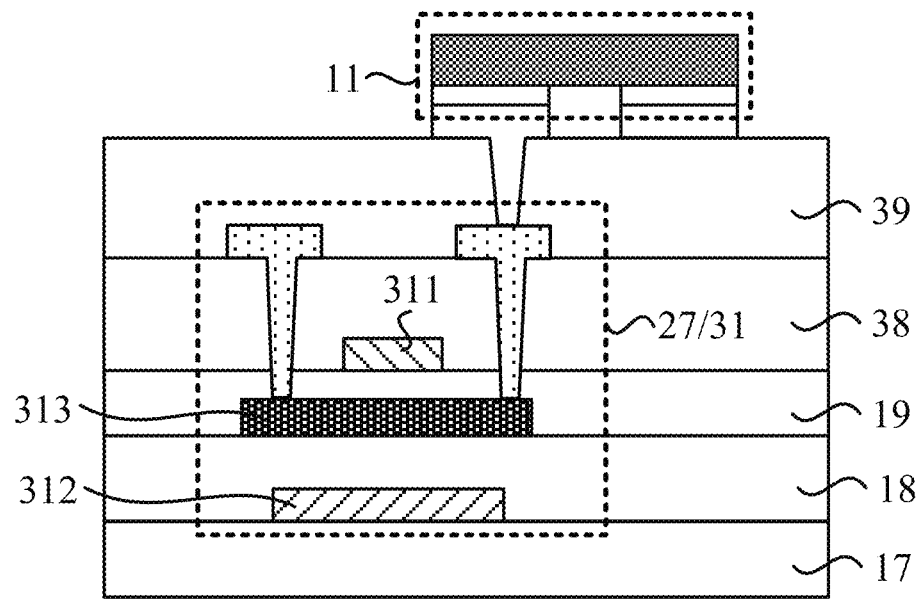
FIG. 22 is a partial cross-sectional diagram of still another display panel provided in an embodiment of the present disclosure.

FIG. 22 is a partial cross-sectional diagram of still another display panel provided in an embodiment of the present disclosure, as shown in FIG. 21 and FIG. 22, at least one of the first reset transistor 27, the data writing transistor 28, the additional transistor 29 or the light-emitting reset transistor 30 is a third double-gate transistor 31, the third double-gate transistor 31 includes a fifth gate 311 and a sixth gate 312, and the fifth gate 311 is electrically connected to the sixth gate 312.

In this embodiment, at least one of the first reset transistor 27, the data writing transistor 28, the additional transistor 29, or the light-emitting reset transistor 30 is set to be the third double-gate transistor 31, compared with the first reset transistor 27, the data writing transistor 28, the additional transistor 29, and the light-emitting reset transistor 30 are all single-gate transistors in the related art, so that the leakage current of at least one of the first reset transistor 27, the data writing transistor 28, the additional transistor 29, or the light-emitting reset transistor 30 at the time of cut-off may be reduced, and thus the power consumption may be further reduced.

Further, at least one of the first reset transistor 27, the data writing transistor 28, the additional transistor 29, or the light-emitting reset transistor 30 is set to be the third double-gate transistor 31, it is also beneficial to reducing the subthreshold swing (SS) of at least one of the first reset transistor 27, the data writing transistor 28, the additional transistor 29, or the light-emitting reset transistor 30, so that the turned-on of the channel is easier, the turned-on speed of the above transistors may be increased, and the response capability of the pixel driver circuit 10 may be enhanced. Meanwhile, the subthreshold swing (SS) is relatively small, and the current when the transistor is cut off may be reduced, so that the on-off ratio is increased, and thus the power consumption lost when the transistor is cut off is reduced.

It should be noted that the first reset transistor 27 being the third double-gate transistor 31 is used as an example only in FIG. 22, in other embodiments, the additional transistor 29 may be set to be the third double-gate transistor 31, and the first reset transistor 27 and the additional transistor 29 are the third double-gate transistor 31, so that the control accuracy of the pixel driver circuit 10 to the drive current may be improved while the leakage current is reduced, whereby it is beneficial to improving the control accuracy of the light-emitting brightness of the light-emitting module 11, but it is not limited thereto, which may be set by those skilled in the art according to actual requirement.

With continued reference to FIG. 22, in an embodiment, the display panel provided in the embodiments of the present disclosure further includes a base substrate 17, the third double-gate transistor 31 is disposed on a side of the base substrate 17, and the third double-gate transistor 31 further includes a third active layer 313. In a direction perpendicular to the base substrate 17, the fifth gate 311 at least partially overlaps with the third active layer 313, and the sixth gate 312 at least partially overlaps with the third active layer 313. The fifth gate 311 is located on a side of the third active layer 313 away from the base substrate 17, and the sixth gate is located on a side of the third active layer 313 close to the base substrate 17; or, the fifth gate 311 and the sixth gate 312 are both located on a side of the third active layer 313 close to the base substrate 17; or, the fifth gate 311 and the sixth gate 312 are located on a side of the third active layer 313 away from the base substrate 17.

In an embodiment, the third double-gate transistor 31 may be prepared on a side of the base substrate 17, the fifth gate 311 and the sixth gate 312 of the third double-gate transistor 31 overlap with the third active layer 313 in the thickness direction of the base substrate 17 to form the channel, and the third dual-gate transistor 31 may be controlled to be turned on or cut off by applying different control signals to the fifth gate 311 and/or the sixth gate 312.

With continued reference to FIG. 22, in an embodiment, the fifth gate 311 is located on a side of the third active layer 313 away from the base substrate 17 as a top gate of the third double-gate transistor 31; the sixth gate is located on a side of the third active layer 313 close to the base substrate 17 as a bottom gate of the third double-gate transistor 31, but it is not limited thereto.

Figure 23:
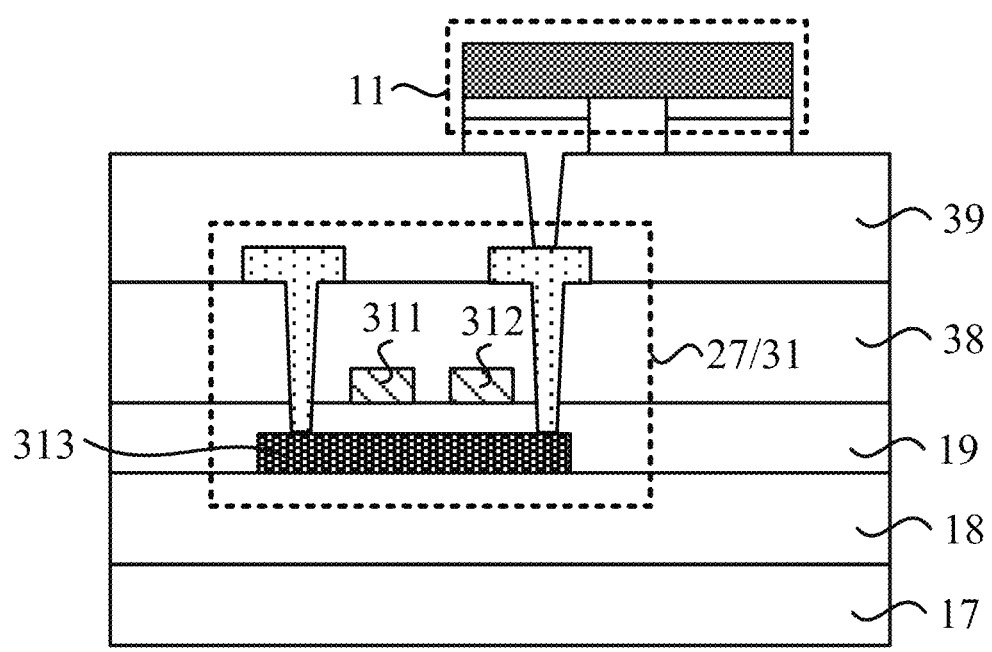
FIG. 23 is a partial cross-sectional diagram of still another display panel provided in an embodiment of the present disclosure.

FIG. 23 is a partial cross-sectional diagram of still another display panel provided in an embodiment of the present disclosure, as shown in FIG. 23, the fifth gate 311 and the sixth gate 312 may each be located on a side of the third active layer 313 close to the base substrate 17.

Figure 24:
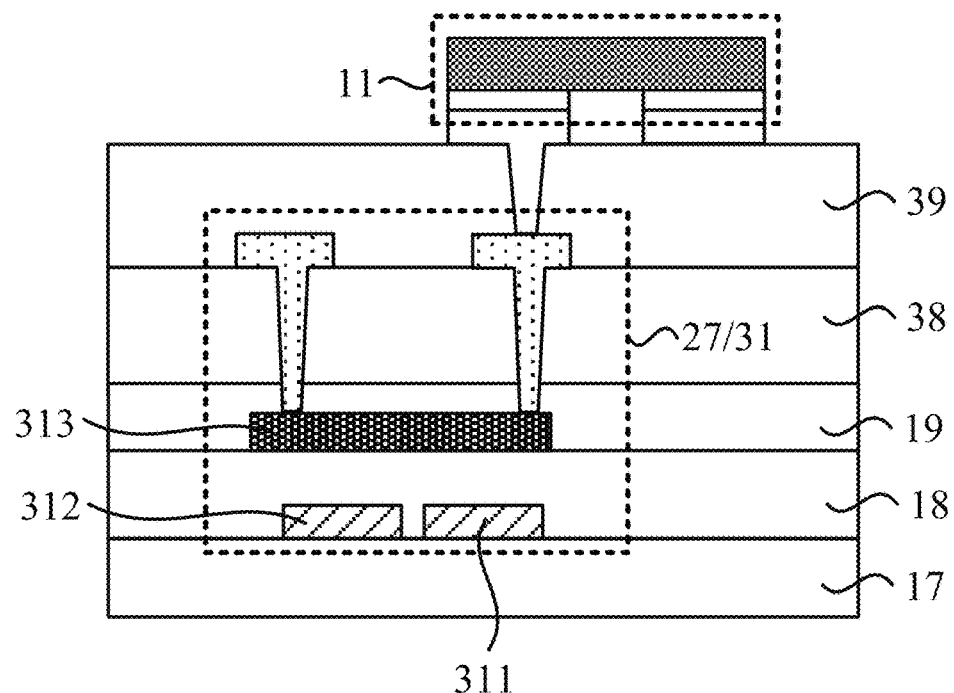
FIG. 24 is a partial cross-sectional diagram of still another display panel provided in an embodiment of the present disclosure.

FIG. 24 is a partial cross-sectional diagram of still another display panel provided in an embodiment of the present disclosure, as shown in FIG. 24, the fifth gate 311 and the sixth gate 312 may also be located on a side of the third active layer 313 away from the base substrate 17, which may be set by those skilled in the art according to actual requirements. It should be understood that as long as the third double-gate transistor 31 is a transistor with a double-gate structure, the effects of reducing the leakage current and reducing the power consumption may be achieved.

With continued reference to FIGS. 13 and 18, in an embodiment, the drive transistor 12 and the light-emitting control transistor 13 are arranged in the first direction X, and in the second direction Y, the first reset transistor 27, the data writing transistor 28, the additional transistor 29 and the light-emitting reset transistor 30 are located on a same side of the drive transistor 12 and the light-emitting control transistor 13. The first direction X and the second direction Y are both parallel to a plane where the display panel is located, and the first direction X intersects with the second direction Y.

In an embodiment, as shown in FIG. 13 and FIG. 18, the drive transistor 12 and the light-emitting control transistor 13 are arranged in the first direction X, so that the drive transistor 12 and the light-emitting control transistor 13 are arranged together, a region through which the drive current flows in the light-emitting stage is concentrated, the transmission path of the drive current is short, the loss of the drive current upon being transmitted is favorably reduced, and thus the power consumption is reduced.

With continued reference to FIG. 13 and FIG. 18, the first reset transistor 27, the data writing transistor 28, the additional transistor 29 and the light-emitting reset transistor 30 are disposed on a same side of the drive transistor 12 and the light-emitting control transistor 13 in the second direction Y, so that the layout occupation space of the pixel driver circuit 10 may be smaller, the pixel density of the display panel may be improved, and meanwhile, by adopting the layout manner, a minimum coupling among the first reset transistor 27, the data writing transistor 28, the additional transistor 29 and the light-emitting reset transistor 30 may be ensured, whereby the performance of the pixel driver circuit 10 is ensured.

With continued reference to FIG. 13 and FIG. 18, in an embodiment, in the thickness direction of the display panel, a projected area of one of the drive transistor 12 and the light-emitting control transistor 13 is larger than a projected area of any one of the first reset transistor 27, the data writing transistor 28, the additional transistor 29, and the light-emitting reset transistor 30.

In an embodiment, as shown in FIG. 13 and FIG. 18, the size of the drive transistor 12 is set to be large, the width-to-length ratio of the drive transistor 12 is increased, so that the drive current generated by the drive transistor 12 is favorably increased, and thus the light-emitting brightness of the light-emitting module 11 is ensured.

Meanwhile, the size of the light-emitting control transistor 13 is set to be large, the width-to-length ratio of the light-emitting control transistor 13 is favorably improved, and the power consumption is favorably reduced.

It should be noted that specific dimensions of the drive transistor 12, the light-emitting control transistor 13, the first reset transistor 27, the data writing transistor 28, the additional transistor 29, and the light-emitting reset transistor 30 may be set according to actual requirements, which is not limited in the embodiments of the present disclosure.

With continued reference to FIGS. 13 and 18, in an embodiment, a width of a channel-to-length ratio of one of the drive transistor 12 or the light-emitting control transistor 13 is greater than the width of the channel-to-length ratio of any one of the first reset transistor 27, the data writing transistor 28, the additional transistor 29, or the light-emitting reset transistor 30.

In an embodiment, as shown in FIG. 13 and FIG. 18, the width of the channel-to-length ratio of the drive transistor 12 is set to be large, so that the drive current generated by the drive transistor 12 is favorably improved, and thus the light-emitting brightness of the light-emitting module 11 is ensured.

At the same time, the width of the channel-to-length ratio of the light-emitting control transistor 13 is set to be large, which is beneficial to reducing the power consumption.

It should be noted that specific values of channel width-to-length ratios of the drive transistor 12, the light-emitting control transistor 13, the first reset transistor 27, the data writing transistor 28, the additional transistor 29, and the light-emitting reset transistor 30 may be set according to actual requirements, which is not limited in the embodiments of the present disclosure.

Figure 25:
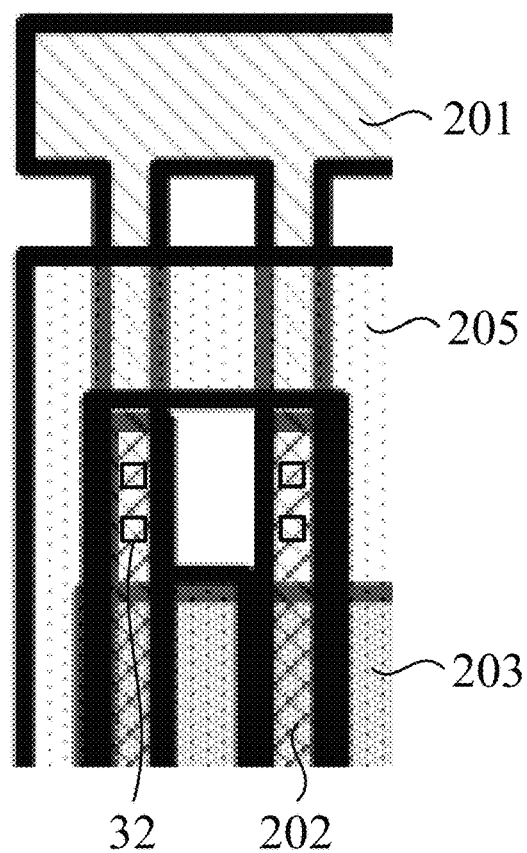
FIG. 25 is a schematic structural diagram of a partial layout of still another pixel driver circuit provided in an embodiment of the present disclosure.

FIG. 25 is a schematic structural diagram of a partial layout of still another pixel driver circuit provided in an embodiment of the present disclosure, as shown in FIG. 10 and FIG. 25, in the thickness direction of the display panel, the third gate 201 at least partially overlaps with the fourth gate 202.

As shown in FIG. 10 and FIG. 25, the third gate 201 and the fourth gate 202 are disposed in the thickness direction of the display panel, so that the third gate 201 and the fourth gate 202 may be directly connected through punching, the structure is simple, and implementation is easy.

In an embodiment, as shown in FIG. 10 and FIG. 25, an electrical connection between the third gate 201 and the fourth gate 202 is achieved through a first via hole 32, but it is not limited thereto.

Figure 26:
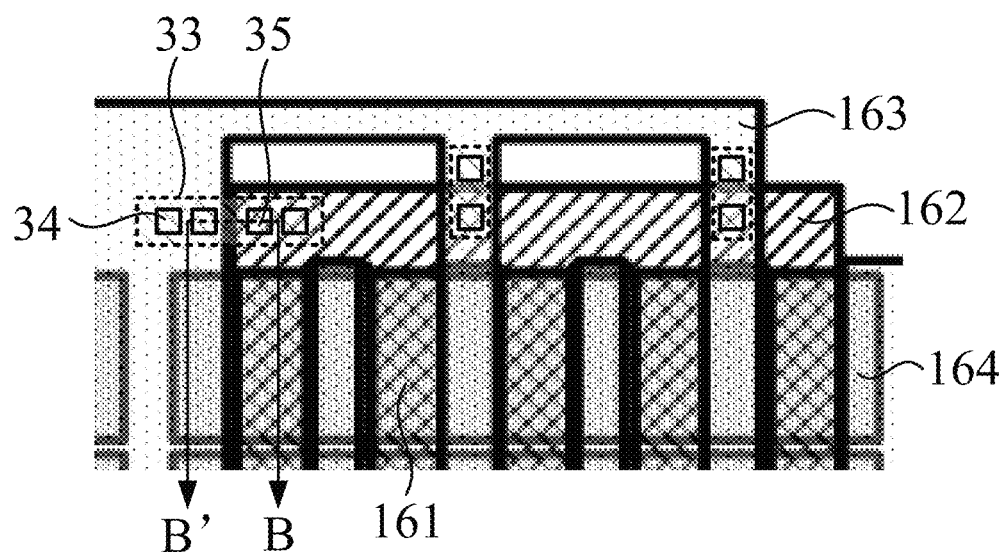
FIG. 26 is a schematic structural diagram of a partial layout of still another pixel driver circuit provided in an embodiment of the present disclosure.
Figure 27:
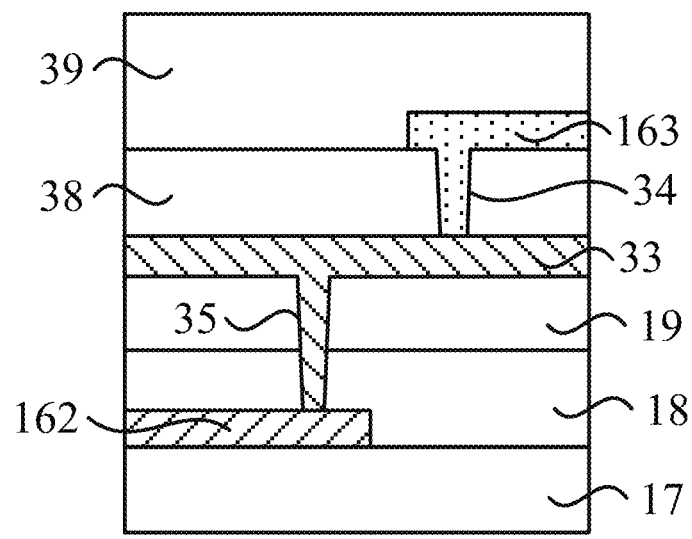
FIG. 27 a cross-sectional diagram taken along a B-B' direction in FIG. 26.

FIG. 26 is a schematic structural diagram of a partial layout of still another pixel driver circuit provided in an embodiment of the present disclosure, and FIG. 27 a cross-sectional diagram taken along a B-B' direction in FIG. 26, as shown in FIG. 26 and FIG. 27, the first gate 161 is located on a side of the first active layer 164 away from the base substrate 17, and the second gate 162 is located on a side of the first active layer 164 close to the base substrate 17. The display panel further includes a conductive connection layer 33. In a direction perpendicular to the base substrate 17, the second gate 162 at least partially overlaps with the conductive connection layer 33, and the first source 163 at least partially overlaps with the conductive connection layer 33. The second gate 162 and the first source 163 are electrically connected to the conductive connection layer 33, respectively.

In an embodiment, as shown in FIG. 26 and FIG. 27, the second gate 162 is located on the side of the first active layer 164 close to the base substrate 17 and is further from the first source 163, in this embodiment, the conductive connection layer 33 is disposed between the second gate 162 and the first source 163, and the second gate 162 at least partially overlaps with the conductive connection layer 33, so that the second gate 162 and the conductive connection layer 33 may be connected through punching, and meanwhile, the first source 163 at least partially overlaps with the conductive connection layer 33, so that the first source 163 and the conductive connection layer 33 may be connected through punching, and thus an electrical connection between the second gate electrode 162 and the first source electrode 163 is achieved, where the second gate 162 and the first source 163 are electrically connected through the conductive connection layer 33, so that a deep punching may be avoided, the process difficulty is reduced, and meanwhile, the problem of poor contact caused by overlarge punching depth may be avoided, and the stability of the electric connection is ensured.

It should be noted that the second gate 162 and the first source 163 are electrically connected through the conductive connection layer 33, so that the second gate 162 and the first source 163 may not overlap in the thickness direction of the base substrate 17, i.e., in the direction perpendicular to the base substrate 17, a gap exists between a vertical projection of the second gate 162 and a vertical projection of the first source 163, therefore, the layout flexibility of all film layers of the display panel may be improved, the signal coupling between all film layers may be favorably reduced, and thus the performance of the pixel driver circuit 10 is improved.

In an embodiment, as shown in FIG. 26 and FIG. 27, an electrical connection between the first source 163 and the conductive connection layer 33 is achieved through a second via hole 34, and an electrical connection between the second gate 162 and the first source 163 is achieved through a third via hole 35, whereby an electrical connection between the second gate 162 and the first source 163 is achieved, but it is not limited thereto.

With continued reference to FIG. 26, in an embodiment, the conductive connection layer 33 and the first gate 161 are disposed on a same layer.

In an embodiment, as shown in FIG. 26, the conductive connection layer 33 and the first gate 161 may be disposed on the same layer, and the arrangement of one metal layer may be reduced, so that the purposes of reducing the production cost and reducing the thickness of the display panel are achieved. Meanwhile, the conductive connection layer 33 may be made of the same material as the first gate 161, so that the conductive connection layer 33 may be prepared in the same process as the first gate 161, whereby the process time is shortened.

In other embodiments, a film layer position of the conductive connection layer 33 may also be set according to actual requirements, which may be set by those skilled in the art according to actual requirements.

Figure 28:
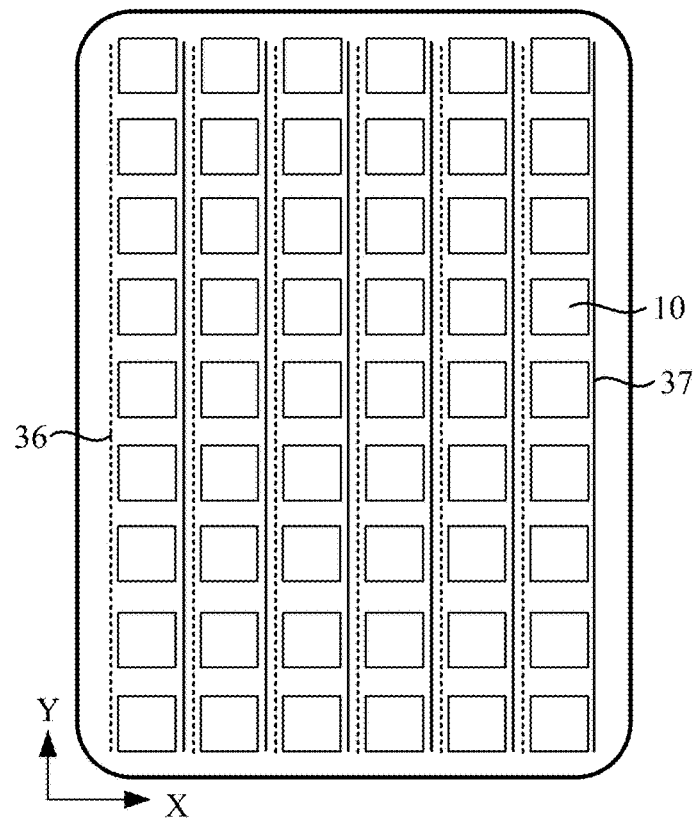
FIG. 28 is a schematic structural diagram of another display panel provided in an embodiment of the present disclosure.

FIG. 28 is a schematic structural diagram of another display panel provided in an embodiment of the present disclosure, as shown in FIG. 18 and FIG. 28, the display panel provided in the embodiments of the present disclosure further includes a first power supply signal line 36 and a second power supply signal line 37 which are alternately arranged in the first direction X, the first power supply signal line 36 is electrically connected to the first power supply signal terminal PVDD, and the second power supply signal line 37 is electrically connected to the second power supply signal terminal PVDD. In the first direction X, the pixel driver circuit 10 is located between the first power supply signal line PVDD and the second power supply signal line PVEE.

In an embodiment, as shown in FIGS. 18 and 28, the first power supply signal line 36 and the second power supply signal line 3 are arranged in the first direction X, extend in the second direction Y, where the first direction X intersects the second direction Y.

It should be understood that in the light-emitting stage, a first power supply signal provided by the first power supply signal terminal PVDD reaches the second power signal terminal PVEE through the light-emitting control transistor 13, the drive transistor 12 and the light-emitting module 11 in the pixel driver circuit 10, so that a current path is formed, whereby drive current generated by the drive transistor 12 is provided to the light-emitting module 11 so as to drive the light-emitting module 11 to emit light. Therefore, in this embodiment, the pixel driver circuit 10 is disposed between the first power supply signal line PVDD and the second power supply signal line PVEE in the first direction X, so that a path of the first power supply signal provided by the first power supply signal terminal PVDD to the second power supply signal terminal PVEE through the pixel driver circuit 10 is facilitated to be shorter, and thus the power consumption is favorably reduced.

Figure 29:
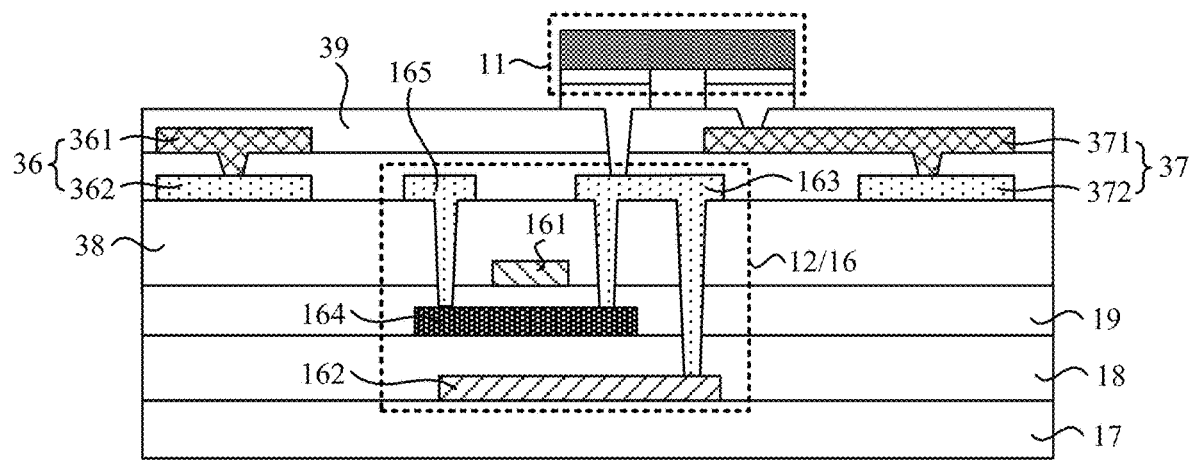
FIG. 29 is a partial cross-sectional diagram of still another display panel provided in an embodiment of the present disclosure.

FIG. 29 is a partial cross-sectional diagram of still another display panel provided in an embodiment of the present disclosure, as shown in FIGS. 18 and 29, the first power supply signal line 36 includes a first sub-signal line 361 and a second sub-signal line 362 connected to each other, and the first sub-signal line 361 and the second sub-signal line 362 are disposed at different layers; and/or, the second power supply signal line 37 includes a third sub-signal line 371 and a fourth sub-signal line 372 connected to each other, and the third sub-signal line 371 and the fourth sub-signal line 372 are disposed at different layers.

In an embodiment, as shown in FIG. 18 and FIG. 29, the first sub-signal line 361 and the second sub-signal line 362 are set to be connected in parallel to form the first power supply signal line 36, so that resistance on the first power supply signal line 36 may be reduced, the line loss of the first power supply signal on the first power supply signal line 36 is reduced, and the display uniformity is favorably improved.

Further, as shown in FIGS. 18 and 29, the first sub-signal line 361 and the second sub-signal line 362 are disposed at different layers, the first sub-signal line 361 and the second sub-signal line 362 may overlap in the thickness direction of the display panel, as compared with the first sub-signal line 361 and the second sub-signal line 362 being disposed on the same layer, so that a total projection area of the first sub-signal line 361 and the second sub-signal line 362 on the plane where the display panel is located may be reduced, whereby the transmittance of the display panel may be favorably improved, and when an under-screen fingerprint identification module and other light sensing devices are disposed in the display panel, the use performance of the light sensing devices may be favorably improved.

With continued reference to FIG. 18 and FIG. 29, in an embodiment, the third sub-signal line 371 and the fourth sub-signal line 372 may set to be connected in parallel to form the second power supply signal line 37, so as to reduce resistance on the second power supply signal line 37, and thus reduce the line loss of the second power supply signal on the second power supply signal line 37, whereby the display uniformity is favorably improved.

Further, as shown in FIGS. 18 and 29, the third sub-signal line 371 and the fourth sub-signal line 372 are disposed at different layers, so that the third sub-signal line 371 and the fourth sub-signal line 372 may overlap in the thickness direction of the display panel, whereby an occupied area of the second power supply signal line 37 is reduced, and the PPI of the display panel is favorably improved.

With continued reference to FIG. 18 and FIG. 29, the second sub-signal line 362 and the fourth sub-signal line 372 may be disposed on the same layer as the first source 163 and the first drain 165, and the arrangement of one metal layer may be reduced, so that the purposes of reducing the production cost and reducing the thickness of the display panel are achieved. Meanwhile, the second sub-signal line 362 and the fourth sub-signal line 372 may adopt the same material as the first source 163 and the first drain 165, so that the second sub-signal line 362 and the fourth sub-signal line 372 may be prepared in the same process as the first source 163 and the first drain 165, and thus the process time is shortened.

Moreover, generally, a film metal layer where the first source 163 and the first drain 165 are located is formed by Ti/Al/Ti metal lamination, Al has small resistance, and the second sub-signal line 362 and the fourth sub-signal line 372 are disposed on the film layer where the first source 163 and the first drain 165 are located, so that the voltage drop of signals on the first power supply signal line 36 and the second power supply signal line 37 may be further reduced, and further, the line loss of signals on the first power supply signal line 36 and the second power supply signal line 37 is reduced, and thus the display uniformity is favorably improved.

Further, as shown in FIGS. 18 and 29, the first sub-signal line 361 and the third sub-signal line 371 may be disposed on a side of the first source 163 and the first drain 165 away from the base substrate 17, and the first sub-signal line 361 and the third sub-signal line 371 may be formed by using a Ti/Al/Ti metal stack, whereby the resistances of the first sub-signal line 361 and the third sub-signal line 371 are reduced, and further, the voltage drop of the signals on the first power supply signal line 36 and the second power supply signal line 37 is reduced, the line loss of the signals on the first power supply signal line 36 and the second power supply signal line 37 is reduced, and thus the display uniformity is improved.

It should be noted that specific film layers of the first sub-signal line 361, the second sub-signal line 362, the third sub-signal line 371, and the fourth sub-signal line 372 are not limited to the above-described embodiments, which may be set by those skilled in the art according to actual requirements.

Moreover, the display panel provided in the embodiments of the present disclosure is not limited to the above structures, and may also include other structures, which may be set by those skilled in the art according to actual requirements.

For example, as shown in FIG. 2, FIG. 9, FIG. 10, FIGS. 22 to FIG. 24, FIG. 27, and FIG. 29, an interlayer insulating layer 38 and a planarization layer 39 may also be disposed on a side of the gate insulating layer 19 away from the base substrate 17 to isolate the various metal layers, which is not limited in the embodiments of the present disclosure.

Figure 30:
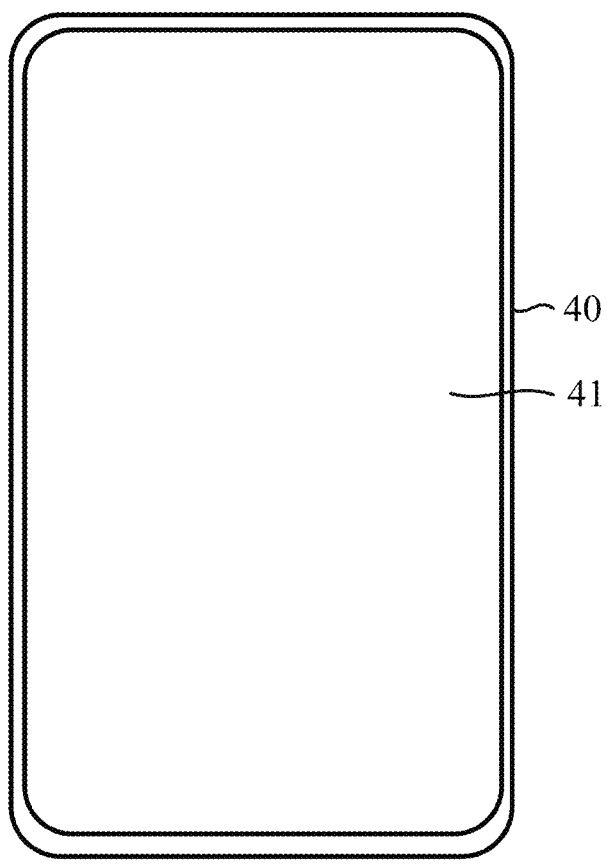
FIG. 30 is a schematic structural diagram of a display device provided in an embodiment of the present disclosure.

Based on the same inventive concept, an embodiment of the present disclosure further provides a display device, FIG. 30 is a schematic structural diagram of a display device provided in an embodiment of the present disclosure, and as shown in FIG. 30, the display device 40 includes the display panel 41 of any of the embodiments of the present disclosure, and therefore, the display device 40 provided in the embodiments of the present disclosure has the technical effects of the technical scheme in any of the above-described embodiments, and explanations of structures and terms which are the same as or correspond to those of the above-described embodiments are not repeated here.

The display device 40 provided in the embodiments of the present disclosure may be a mobile phone as shown in IG. 30 or any electronic product with a display function, including but not limited to the following categories: a television, a notebook computer, a desktop display, a tablet computer, a digital camera, an intelligent bracelet, intelligent glasses, a vehicle-mounted display, medical equipment, industrial control equipment, a touch interaction terminal and the like, and the present embodiments are not particularly limited thereto.

The above-described specific implementations should not be construed as limiting the scope of protection of the present disclosure. It should be understood by those skilled in the art that various modifications, combinations, sub-combinations and substitutions may be made depending on design requirements and other factors. Any modification, equivalent replacement, and improvement made within the spirit and principle of the present disclosure should be included in the scope of protection of the present disclosure.

What is claimed is:

1. A display panel, comprising a pixel driver circuit; wherein,
    the pixel driver circuit comprises a light-emitting module, a drive transistor and at least one light-emitting control transistor;
    the drive transistor, the at least one light-emitting control transistor and the light-emitting module are connected in series between a first power supply signal terminal and a second power supply signal terminal;
    the drive transistor is configured to drive the light-emitting module to emit light in a light-emitting stage;
    the at least one light-emitting control transistor is configured to provide drive current generated by the drive transistor to the light-emitting module in the light-emitting stage;
    at least one of the drive transistor or a light-emitting control transistor of the at least one light-emitting control transistor is a first double-gate transistor; and
    the first double-gate transistor comprises a first gate, a second gate and a first source, and the second gate is electrically connected to the first source,
    wherein at least one of the drive transistor or the light-emitting control transistor is a second double-gate transistor; and
    the second double-gate transistor comprises a third gate and a fourth gate, and the third gate is electrically connected to the fourth gate,
    wherein the first double-gate transistor comprises a plurality of first double-gate sub-transistors, and the plurality of first double-gate sub-transistors are connected in parallel, and wherein the second double-gate transistor comprises a plurality of second double-gate sub-transistors, and the plurality of second double-gate sub-transistors are connected in parallel.

2. The display panel of claim 1, further comprising a base substrate, wherein,
    the second double-gate transistor is disposed on a side of the base substrate;
    the second double-gate transistor further comprises a second active layer;
    in a direction perpendicular to the base substrate, the third gate at least partially overlaps with the second active layer, and the fourth gate at least partially overlaps with the second active layer; and
    the third gate is located on a side of the second active layer away from the base substrate, and the fourth gate is located on a side of the second active layer close to the base substrate.

3. The display panel of claim 1, wherein the at least one light-emitting control transistor is the second double-gate transistor, wherein,
    the at least one light-emitting control transistor comprises a first light-emitting control transistor and a second light-emitting control transistor;
    a gate of the first light-emitting control transistor is electrically connected to a first light-emitting control signal terminal, a first electrode of the first light-emitting control transistor is electrically connected to the first power supply signal terminal, and a second electrode of the first light-emitting control transistor is electrically connected to a first electrode of the drive transistor;
    a gate of the second light-emitting control transistor is electrically connected to a second light-emitting control signal terminal, a first electrode of the second light-emitting control transistor is electrically connected to a second electrode of the drive transistor, and a second electrode of the second light-emitting control transistor is electrically connected to the light-emitting module; and
    at least one of the first light-emitting control transistor or the second light-emitting control transistor is the second double-gate transistor,
    wherein the first light-emitting control signal terminal and the second light-emitting control signal terminal are a same control signal terminal.

4. The display panel of claim 1, wherein the at least one light-emitting control transistor and the drive transistor are disposed adjacent to each other.

5. The display panel of claim 1, wherein the drive transistor is the first double-gate transistor.

6. The display panel of claim 1, wherein a length of a channel of the first double-gate transistor is L1, a width of the channel of the first double-gate transistor is W1, and wherein 3 μm≤L1≤30 μm, and 10 μm≤W1≤30000 μm, and
    wherein a length of a channel of the second double-gate transistor is L2, a width of the channel of the second double-gate transistor is W2, and wherein 3 μm≤L2≤30 μm, and 10 μm≤W2≤30000 μm.

7. The display panel of claim 1, wherein a width-to-length ratio of a channel of the first double-gate transistor is D1, and wherein 10/30≤D1≤30000/3, and
    wherein a width-to-length ratio of a channel of the second double-gate transistor is D2, and wherein 10/30≤D2≤30000/3.

8. The display panel of claim 1, wherein
wherein the light-emitting module comprises at least two light-emitting diodes, and the at least two light-emitting diodes are connected in series or in parallel.

9. The display panel of claim 1, wherein in a thickness direction of the display panel, the third gate at least partially overlaps with the fourth gate.

10. The display panel of claim 1, wherein,
the display panel further comprises a first power supply signal line and a second power supply signal line which are alternately arranged in the first direction;
the first power supply signal line is electrically connected to the first power supply signal terminal, and the second power supply signal line is electrically connected to the second power supply signal terminal; and
in the first direction, the pixel driver circuit is located between the first power supply signal line and the second power supply signal line.

11. The display panel of claim 10, wherein the display panel comprises at least one of:
the first power supply signal line comprises a first sub-signal line and a second sub-signal line which are connected to each other, and the first sub-signal line and the second sub-signal line are disposed at different layers; or,
the second power supply signal line comprises a third sub-signal line and a fourth sub-signal line which are connected to each other, and the third sub-signal line and the fourth sub-signal line are disposed at different layers.

12. A display device, comprising the display panel of claim 1.

13. A display panel, comprising a pixel driver circuit;
wherein the pixel driver circuit comprises a light-emitting module, a drive transistor and at least one light-emitting control transistor;
the drive transistor, the at least one light-emitting control transistor and the light-emitting module are connected in series between a first power supply signal terminal and a second power supply signal terminal;
the drive transistor is configured to drive the light-emitting module to emit light in a light-emitting stage;
the at least one light-emitting control transistor is configured to provide drive current generated by the drive transistor to the light-emitting module in the light-emitting stage;
at least one of the drive transistor or a light-emitting control transistor of the at least one light-emitting control transistor is a first double-gate transistor; and
the first double-gate transistor comprises a first gate, a second gate and a first source, and the second gate is electrically connected to the first source, wherein the display panel further comprises a base substrate, wherein,
the first double-gate transistor is disposed on a side of the base substrate;
the first double-gate transistor further comprises a first active layer;
in a direction perpendicular to the base substrate, the first gate at least partially overlaps with the first active layer, and the second gate at least partially overlaps with the first active layer; and
wherein the first gate is located on a side of the first active layer away from the base substrate, and the second gate is located on a side of the first active layer close to the base substrate;
the display panel further comprises a conductive connection layer,
in a direction perpendicular to the base substrate, the second gate at least partially overlaps with the conductive connection layer, and the first source at least partially overlaps with the conductive connection layer; and
the second gate and the first source are electrically connected to the conductive connection layer, respectively,
wherein the conductive connection layer and the first gate are disposed on a same layer.

14. A display device, comprising the display panel of claim 13.

15. A display panel, comprising a pixel driver circuit;
wherein the pixel driver circuit comprises a light-emitting module, a drive transistor and at least one light-emitting control transistor;
the drive transistor, the at least one light-emitting control transistor and the light-emitting module are connected in series between a first power supply signal terminal and a second power supply signal terminal;
the drive transistor is configured to drive the light-emitting module to emit light in a light-emitting stage;
the at least one light-emitting control transistor is configured to provide drive current generated by the drive transistor to the light-emitting module in the light-emitting stage;
at least one of the drive transistor or a light-emitting control transistor of the at least one light-emitting control transistor is a first double-gate transistor; and
the first double-gate transistor comprises a first gate, a second gate and a first source, and the second gate is electrically connected to the first source,
wherein the pixel driver circuit further comprises:
a first reset transistor, wherein a gate of the first reset transistor is electrically connected to a first scan signal terminal, a first electrode of the first reset transistor is electrically connected to a reference signal terminal, and a second electrode of the first reset transistor and a gate of the drive transistor are connected to a first node;
a data writing transistor, wherein a gate of the data writing transistor is electrically connected to a second scan signal terminal, a first electrode of the data writing transistor is electrically connected to a data signal terminal, and a second electrode of the data writing transistor is electrically connected to a first electrode of the drive transistor;
an additional transistor, wherein a gate of the additional transistor is electrically connected to the second scan signal terminal, a first electrode of the additional transistor is electrically connected to a second electrode of the drive transistor, and a second electrode of the additional transistor is electrically connected to the first node;
a first capacitor, wherein one end of the first capacitor is electrically connected to the first power supply signal terminal, and another end of the first capacitor is electrically connected to the first node; and
a light-emitting reset transistor, wherein a gate of the light-emitting reset transistor is connected to the second scan signal terminal, a first electrode of the light-emitting reset transistor is electrically connected to the reference signal terminal, and a second electrode of the light-emitting reset transistor is electrically connected to the light-emitting module, wherein the drive transistor and the at least one light-emitting control transistor are arranged in a first direction;

in a second direction, the first reset transistor, the data writing transistor, the additional transistor and the light-emitting reset transistor are located on a same side of the drive transistor and the at least one light-emitting control transistor; and the first direction and the second direction are both parallel to a plane where the display panel is located, and the first direction intersects with the second direction.

16. The display panel of claim 15, wherein, at least one of the first reset transistor, the data writing transistor, the additional transistor, or the light-emitting reset transistor is a third double-gate transistor; and the third double-gate transistor comprises a fifth gate and a sixth gate, and the fifth gate is electrically connected to the sixth gate, wherein, the display panel further comprises a base substrate, and the third double-gate transistor is disposed on a side of the base substrate;

the third double-gate transistor further comprises a third active layer;

in a direction perpendicular to the base substrate, the fifth gate at least partially overlaps with the third active layer, and the sixth gate at least partially overlaps with the third active layer;

the fifth gate is located on a side of the third active layer away from the base substrate, and the sixth gate is located on a side of the third active layer close to the base substrate;

the fifth gate and the sixth gate are located on a side of the third active layer close to the base substrate; or the fifth gate and the sixth gate are located on a side of the third active layer away from the base substrate.

17. The display panel of claim 15, wherein in a thickness direction of the display panel, a projection area of one of the drive transistor or the at least one light-emitting control transistor is larger than a projection area of one of the first reset transistor, the data writing transistor, the additional transistor or the light-emitting reset transistor.

18. The display panel of claim 15, wherein a width-to-length ratio of a channel of one of the drive transistor or the at least one light-emitting control transistor is greater than a width-to-length ratio of a channel of one of the first reset transistor, the data writing transistor, the additional transistor or the light-emitting reset transistor.

19. A display device, comprising the display panel of claim 15.

* * * * *